(12) United States Patent
Aikiyo et al.

(10) Patent No.: US 6,996,145 B2
(45) Date of Patent: Feb. 7, 2006

(54) SEMICONDUCTOR LASER MODULE, AND METHOD FOR DRIVING THE SEMICONDUCTOR LASER MODULE

(75) Inventors: Takeshi Aikiyo, Tokyo (JP); Chihomi Furuhashi, Tokyo (JP); Takashi Koseki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 549 days.

(21) Appl. No.: 09/884,147

(22) Filed: Jun. 20, 2001

(65) Prior Publication Data

US 2001/0055346 A1    Dec. 27, 2001

Related U.S. Application Data

(63) Continuation-in-part of application No. PCT/JP00/03147, filed on May 17, 2000, which is a continuation-in-part of application No. 09/443,322, filed on Nov. 19, 1999.

(30) Foreign Application Priority Data

| Nov. 1, 1999 | (JP) | ............................... 11-310992 |
| Jun. 22, 2000 | (JP) | ............................ 2000-187976 |
| Jun. 22, 2000 | (JP) | ............................ 2000-187977 |

(51) Int. Cl.
*H01S 3/00* (2006.01)
*H01S 3/04* (2006.01)

(52) U.S. Cl. ............... 372/38.07; 372/38.1; 372/38.01; 372/34

(58) Field of Classification Search ............... 372/38.1, 372/38.01, 38.02, 38.07, 38.04; 62/3.2, 3.7
See application file for complete search history.

(56) References Cited

U.S. PATENT DOCUMENTS

| 4,803,361 | A | * | 2/1989 | Aiki et al. ..................... 385/49 |
| 4,999,728 | A | * | 3/1991 | Curl ............................. 361/33 |
| 5,164,874 | A | * | 11/1992 | Okano et al. ................. 361/56 |
| 5,245,499 | A | | 9/1993 | Senes |
| 5,515,682 | A | * | 5/1996 | Nagakubo et al. ............ 62/3.7 |
| 5,602,860 | A | * | 2/1997 | Masonson ..................... 372/34 |
| 5,845,031 | A | | 12/1998 | Aoki |
| 6,385,222 | B1 | * | 5/2002 | Aikiyo ..................... 372/38.02 |

FOREIGN PATENT DOCUMENTS

| JP | 52-61982 | 5/1977 |
| JP | 62-149858 | 9/1987 |

(Continued)

*Primary Examiner*—Minsun Harvey
*Assistant Examiner*—Armando Rodriguez
(74) *Attorney, Agent, or Firm*—Lacasse & Associates, LLC

(57) ABSTRACT

The invention provides a semiconductor laser module which can suppress overcurrent flowing into a thermo-module, wherein the thermo-module (5) carries out a heating action when a reverse current flows from lead pin (16*f*) through lead pin (16*a*), and contrarily carries out a cooling action when a current flows from the lead pin (16*a*) through the lead pin (16*f*). An overcurrent limiting means (20) is provided, which can suppress overcurrent flowing into the thermo-module (5) in its heating direction. The overcurrent limiting circuit (20) is provided with a bypass line (21), a resistor (22), and a diode (23). When a current flows in the heating direction, the diode (23) is turned on, whereby the current is shunted to the thermo-module (5) and bypass line (21) for flow, and accordingly, the overcurrent flowing into the thermo-module (5) can be effectively suppressed.

32 Claims, 14 Drawing Sheets

FOREIGN PATENT DOCUMENTS

| | | |
|---|---|---|
| JP | 2-15762 | 1/1990 |
| JP | 2-47077 | 3/1990 |
| JP | 02-170582 | 7/1990 |
| JP | 02305485 | 12/1990 |
| JP | 05-102602 | 4/1993 |
| JP | 05-299777 | 11/1993 |
| JP | 07022181 | 1/1995 |
| JP | 07-273407 | 4/1995 |
| JP | 8213688 | 8/1996 |
| JP | 09064450 | 3/1997 |
| JP | 09-271040 | 9/1998 |
| JP | 11-040896 | 2/1999 |
| JP | 11126939 | 5/1999 |
| JP | 11251675 | 9/1999 |
| JP | 11289045 | 10/1999 |
| JP | 2000216474 | 8/2000 |

* cited by examiner

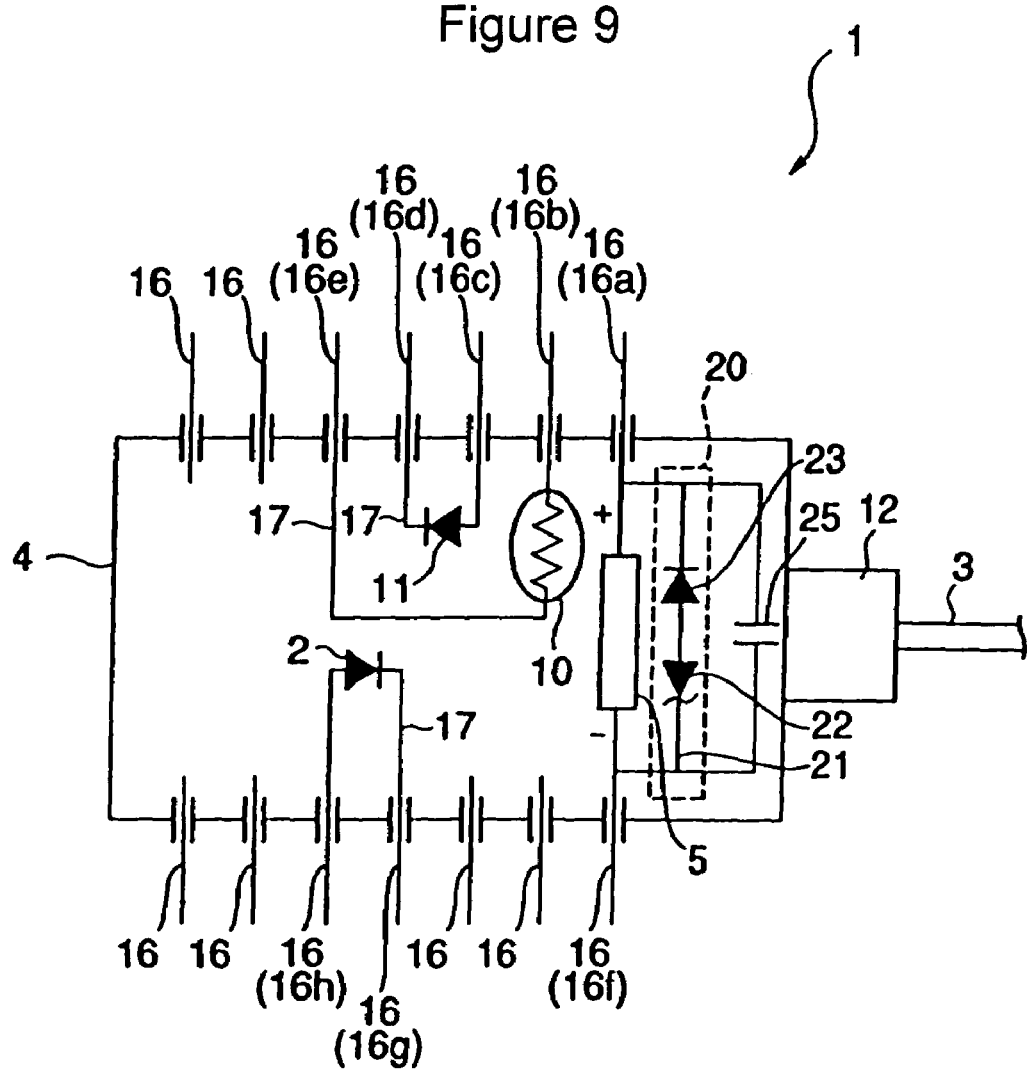

SEMICONDUCTOR LASER MODULE, AND METHOD FOR DRIVING THE SEMICONDUCTOR LASER MODULE

This application is a continuation-in-part of PCT international application PCT/JP00/03147 filed May 17, 2000 which claims priority from Japanese Application No. 11-310992 filed Nov. 1, 1999; and further claims priority from U.S. application Ser. No. 09/443,322 filed Nov. 19, 1999; Japanese Application No. 2000-187976 filed Jun. 22, 2000; and Japanese Application No. 2000-187977 filed Jun. 22, 2000.

FIELD OF THE INVENTION

The present invention relates to a semiconductor laser module used in the field of optical transmissions and a method for driving the semiconductor laser module, and in particular the invention provides a transmission device equipped with the semiconductor laser module.

BACKGROUND OF THE INVENTION

Referring to FIG. 6a, a view of one exemplary configuration of a semiconductor laser module is shown in cross section. In FIG. 6b is shown an example of electric wiring diagram of the semiconductor laser module of FIG. 6a. The semiconductor laser module 1 is such that a semiconductor laser element 2 and an optical fiber 3 are optically coupled together forming a module.

A thermo-module 5 is provided on the inner bottom wall plane 4a of a package 4. The thermo-module 5 is constructed in such a form that a plurality of Peltier elements 5a are placed between plate member 5b (first substrate, first board) and plate member 5c (second substrate, second board) which are insulation substrates made of, for example, alumina (aluminum oxide), aluminum nitride, or another suitable material. In this example, the plate member 5b is fixed on the inner bottom wall plane 4a of the package 4, and the heat radiation side of the Peltier elements 5a are secured on the plate member 5b by soldering, and the plate member 5c is secured on the heat absorption side of the Peltier elements 5a by soldering.

Such a thermo-module 5 changes the heat emission action (heating action) and the heat absorption action (cooling action) in response to orientation of a current which flows in the Peltier elements 5a, wherein the heat emission quantity and heat absorption quantity vary in response to the amount of current flow within the Peltier elements 5a.

A substrate 6 which is a member for attaching components is installed and fixed on the upper side of the thermo-module 5 (the plate member 5c) by solder consisting of, for example, InPbAg eutectic solder having a melting point of 148° C. Supporting members 7 and 8, and a lens 9 are fixed on the upper side of the substrate 6. On the supporting member 7, the semiconductor laser element 2 is disposed, and a thermister 10 for detecting the temperature of the semiconductor laser element 2 is provided. On the supporting member 8, a photo diode 11 is disposed for monitoring a light emitting state of the semiconductor laser element 2. Typically, a laser element having signal light wavelength bands of, for example, 1310 nm and 1550 nm, and wavelength bands of pumping light for optical fiber amplifiers such as a 1480 nm band and a 980 nm band, etc. is used as the semiconductor laser element 2.

A through hole 4c is provided at the side wall 4b of the package 4, and an optical fiber supporting member 12 is fitted in the through hole 4c and mounted therein. The optical fiber supporting member 12 has an insertion hole 12a, wherein an end portion of an optical fiber 3 is introduced from the outside of the package 4 through the insertion hole 12a. Also, a lens 14 is disposed inside the insertion hole 12a with a spacing between it and the end portion of the optical fiber 3.

As shown in FIG. 6b, a plurality of lead pins 16 (14 pins in the example shown in FIG. 6b) are formed at the package 4 so as to protrude upward therefrom. In addition, electrical couplings 17 such as conductor patterns and lead wires, etc. are provided in the package 4 to electrically connect the semiconductor laser element 2, thermo-module 5, thermister 10, and photo diode 11 to the abovementioned lead pins 16. By the electrical couplings 17 and lead pins 16, the semiconductor laser element 2, thermo-module 5, thermister 10 and photo diode 11 can, respectively, be electrically connected to a drive controller (not illustrated) for driving the semiconductor laser module.

In detail, in the example shown in FIG. 6b, the semiconductor laser element 2 is electrically connected to the drive controller by the electrical coupling 17 and lead pins 16 (16g and 16h), the thermo-module 5 by the electrical coupling 17 and lead pins 16 (16a and 16f), the thermister 10 by the electrical coupling 17 and lead pins 16 (16b and 16e), and the photo diode 11 by the electrical coupling 17 and lead pins (16c and 16d).

A semiconductor laser module 1 shown in FIG. 6 is constructed as described above. When such a semiconductor laser module 1 is electrically connected to the drive controller and current flows from the drive controller to the semiconductor laser element 2 of the semiconductor laser module 1, laser light is emitted from the semiconductor laser element 2. The emitted laser light is condensed by an optical coupling system comprising the lenses 9 and 14 and is permitted to enter the optical fiber 3, wherein the light propagates through the optical fiber 3 and is used for appointed applications.

However, the intensity and wavelength of laser light emitted from the semiconductor laser element 2 are known to fluctuate in response to the temperature of the semiconductor laser element 2 itself. Therefore, in order to maintain the intensity and wavelength of the laser light constant, the drive controller controls the direction of current flow within the thermo-module 5 and the amount of current flowing therein on the basis of an output value provided from the thermister 10, thereby controlling the heating action and cooling action of the thermo-module 5. Through control by the thermo-module 5, the semiconductor laser element 2 is typically kept at an almost constant temperature, whereby the intensity and wavelength of the laser light emitted from the semiconductor laser element 2 is constant.

By an erroneous operation or an overvoltage, however, there may be caused an abnormal situation in which an overcurrent is fed to the thermo-module 5 in a direction for causing the thermo-module 5 to heat. In this case, the thermo-module 5 is extraordinarily heated so abruptly causing components such as the semiconductor laser element 2, the substrate 6 or the lens 9, as arranged on the thermo-module 5 to be heated such that the indicated temperature of the thermistor 10 rises to 200° C. or higher within 10 seconds.

When the plate member 5c of the thermo-module 5 is thermally connected to the side wall of the package 4 and the optical fiber supporting member 12, a portion of the heat emitted from the thermo-module 5 is discharged from the module via the side wall of the package 4 and the optical fiber supporting member 12. Therefore, when the thermo-module 5 is extraordinarily heated as described above, the amount of heat transmitted to components on the thermo-module 5 such as the semiconductor laser element 2, lens 9, etc., is suppressed since heat is discharged from the thermo-module 5 thereby relieving some of the temperature increase for the components on the thermo-module 5.

But, in the configuration of FIG. 6, the components on the thermo-module 5 are thermally isolated from the sidewall of the package and the optical fiber supporting member 12. Therefore, little of the heat is quickly dissipated through the sidewall of the package 4. In such a case, when the thermo-module 5 is extraordinarily heated to a high temperature, the high temperature heat of the thermo-module 5 is transmitted to the components on the thermo-module 5 and is accumulated there. Accordingly, the temperature rise of the components on the thermo-module 5 is substantial, and the following problematic situations may arise.

For example, as described above, when the temperature of the semiconductor laser element 2 is raised to a high temperature due to rapid heating of the thermo-module 5 resulting from an overcurrent flowing therein in the heating direction, known problems may occur, where a defect in crystal of the semiconductor laser element 2 grows and the characteristics of the semiconductor laser element 2 deteriorate to a large extent.

In addition, as described above, the substrate 6 is fixed on the plate member 5c of the thermo-module 5 by thermal-fusion type connection material, for example, solder such as InPbAg eutectic solder having a melting point of 148° C. For this reason, where the thermo-module 5 is heated to an extraordinarily high temperature, the solder is melted to cause the substrate 6 to be shifted from its original, properly aligned fixed position. The positional shift of the substrate 6 causes the semiconductor laser element 2 and the lens 9 to shift from their originally aligned positions, whereby problems occur such as optical decoupling. The misalignment causes the semiconductor laser element 2 and lens 9 to shift with respect to the optical fiber 3. In particular, if an angular shift of 0.2° occurs in the semiconductor laser element 2 with respect to the optical fiber 3, a 95% loss in optical output may result causing substantial lowering of the optical output intensity.

Further, the glass-made lens 9 is adhered to, for example, a metal-made holder, utilizing glass solder which is fixed at the substrate 6 in order to fix the lens 9 to the substrate 6. In this case, as described above, when the thermo-module 5 is quickly overheated, a crack occurs at the junction point between glass and solder between the lens 9 and the metal holder by a large difference in the thermal expansion ratio between glass and metal. Problems arise, wherein, by occurrence of the crack, the lens 9 dislodges from the metal holder, and the optical coupling between the semiconductor laser element 2 and the optical fiber 3 may be disrupted.

Still further, as described above, since the Peltier element 5a, and plate members 5b and 5c are fixed together with solder, rapid heating causes melting of the solder, whereby, for example, the Peltier element 5a comes off, and the thermo-module 5 itself may be damaged.

The invention was developed to solve the above mentioned problems, and it is therefore an object of the invention to provide a semiconductor laser module that can prevent overcurrent and overvoltage within the thermo-module in the heating direction thereby avoiding problems resulting from overcurrent. It is also an object of the invention to provide a method for driving the semiconductor laser module.

SUMMARY OF THE INVENTION

In order to achieve the above object, a semiconductor laser module according to the invention comprises:

a semiconductor laser element;

a thermo-module for adjusting the temperature of the semiconductor laser element in dependence upon an amount of current flowing into said thermo-module; and, at least one of an overcurrent limiting circuit to suppress an overcurrent flowing into the thermo-module and an overvoltage limiting circuit to suppress application of an overvoltage across said thermo-module.

In accordance with an embodiment the overcurrent limiting circuit includes:

a bypass channel between an upstream side and a downstream side of the thermo-module for bypassing the thermo-module; and a diode disposed within the bypass channel and oriented for allowing current to flow therethrough when the flowing current is oriented in a direction for causing heating of thermo-module;

wherein in use circuit elements within the bypass channel and the diode provide an overcurrent limiting circuit to relieve the flow of an overcurrent in the direction for causing heating in the thermo-module.

In accordance with an embodiment the overcurrent limiting circuit includes:

a zener diode disposed serially to the diode within the bypass channel and oriented opposite to the diode for providing an approximately fixed zener voltage when the flowing current is oriented in a direction for causing heating of thermo-module;

wherein in use the bypass channel, resistor and diode provide an overcurrent limiting circuit to relieve the flow of an overcurrent in the heating direction into said thermo-module.

In accordance with another aspect of the invention there is provided a method for driving a semiconductor laser module having a semiconductor laser element, and a thermo-module for adjusting the temperature of the semiconductor laser element comprising the steps of:

thermally connecting said thermo-module to said semiconductor laser element;

adjusting the temperature of the semiconductor laser element in dependence upon an amount of current flowing into the thermo-module; and suppressing some of an overcurrent flowing into the thermo-module by providing an overcurrent flow limiting circuit for the thermo-module.

In accordance with another aspect of the invention there is provided a transmission device comprising:

a semiconductor laser module having a semiconductor laser element;

a thermo-module for variably adjusting the temperature of the semiconductor laser element in dependence upon an amount of a current flowing into said thermo-module;

an optical fiber optically coupled for receiving laser light emitted from said semiconductor laser element; and at least one of an overcurrent limiting circuit which suppresses an overcurrent from flowing into said thermo-module and an overvoltage limiting circuit which suppresses overvoltage from being applied to said thermo-module is provided.

In an embodiment, at least one of the at least one overcurrent limiting circuit and overvoltage limiting circuit comprises a diode having an orientation in a heating direction of the thermo-module and a Zener diode having an orientation opposite to the orientation of the diode, the diode and the zener diode coupled in series in parallel to the thermo-module.

In accordance with yet another aspect of the invention there is provided a thermo-module for variably controlling a temperature of an object in dependence upon an amount of a current supplied thereto comprising:

a first substrate;

a second substrate;

a plurality of Peltier elements between the first and second substrate; and an overcurrent limiting circuit, wherein the first substrate is extended relative to the second substrate and wherein the overcurrent limiting circuit is disposed on the extended portion of the first substrate.

BRIEF DESCRIPTION OF THE DRAWING

FIG. 9 is an explanatory diagram for indicating an electric wiring example of another embodiment;

BEST MODE FOR CARRYING OUT THE INVENTION

In order to describe the invention in further detail, a description is given of the invention with reference to the accompanying drawings showing the embodiments thereof.

Figure 1:
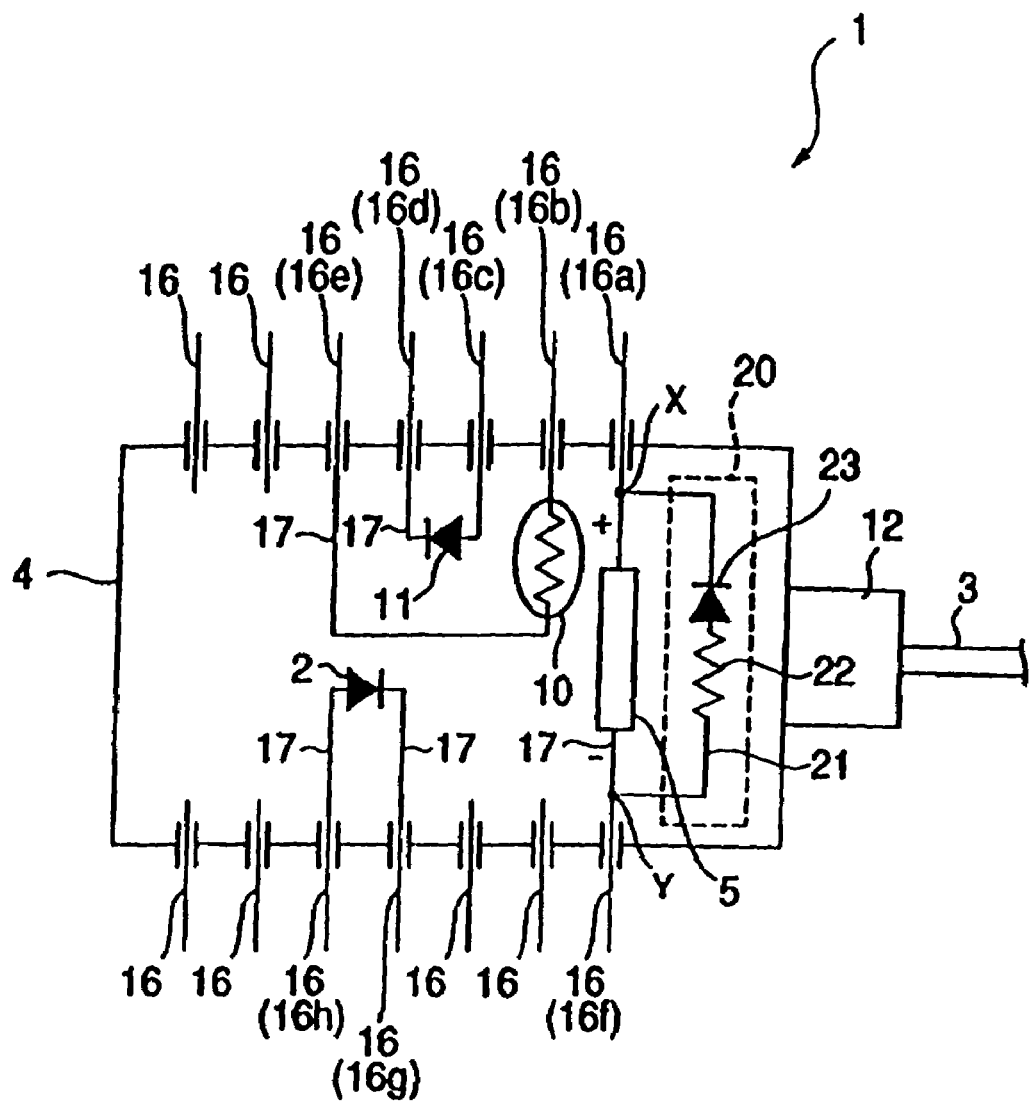
FIG. 1 is an explanatory view showing one example of electric wiring characteristic of a semiconductor laser module according to a first embodiment of the invention.

FIG. 1 shows an example of electric wiring characteristic of a semiconductor laser module according to the first embodiment of the invention. In the first embodiment, a characteristic point resides in that, as shown in FIG. 1, an overcurrent limiting circuit 20 in the form of an overcurrent limiting means that also functions as a reverse current flow limiter is provided. The construction of the device other than the above mentioned overcurrent limiting means is similar to the semiconductor laser module illustrated in FIG. 6. In the description of the first embodiment, parts which are identical to those in the semiconductor laser module shown in FIG. 6 are given the same reference numbers, and any overlapping description thereof is omitted or simplified.

The semiconductor laser module 1 is often used in surroundings whose temperature is higher than ambient, therefore it is often assumed that the thermo-module 5 carries out only a cooling action. However, in the first embodiment, taking into consideration cases where the thermo-module 5 carries out not only the cooling action but also a heating action, an overcurrent limiting circuit 20 as shown below is provided in a package 4.

That is, in the first embodiment, the overcurrent limiting circuit 20 comprises a bypass line 21, a resistor 22, and a diode 23.

In FIG. 1, one end side of the bypass line 21 is coupled to point X at the lead pin 16a of the thermo-module 5, and the other end of the bypass line 21 is coupled to point Y at the lead pin 16f of the thermo-module 5.

The first embodiment is constructed so that the thermo-module 5 carries out a heating action, when a current flows in a direction from the lead pin 16f through the lead pin 16a, and the thermo-module 5 carries out a cooling action, when current flows in the direction from the lead pin 16a through the lead pin 16f. In other words, the bypass line 21 is provided to couple the upstream side Y and downstream side X of the thermo-module 5 in the current flow channel in the heating direction of the thermo-module 5, bypassing the thermo-module 5.

A resister 22 is disposed within the bypass line 21, and a diode 23 oriented such that the current flow direction for heating the thermo-module 5 is a forward direction of the diode, is connected in series to the resistor 22.

The semiconductor laser module 1 shown in the first embodiment is constructed as described above. Hereinafter, a brief description is given of examples of circuit operation of the above mentioned overcurrent limiting circuit 20. For example, the semiconductor laser module is electrically connected to a drive controlling means in the form of a drive controller for driving the semiconductor laser module, through lead pins 16. When a current oriented from the lead pin 16a to the lead pin 16f—a current in the normal "cooling" direction for driving a thermo-module—flows, the diode 23 of the above mentioned overcurrent limiting circuit 20 is off, and the provided current does not flow through the bypass line 21; all of the current flows into the thermo-module 5.

Conversely, when a current (reverse current) oriented from the lead pin 16f to the lead pin 16a flows, that is, a current flows in the normal "heating" direction, the diode 23 is on, and a current in the heating direction is directed to the thermo-module 5 and bypass path 21 in proportion to the ratio of the resistance value of the thermo-module 5 to that of the resistor 22.

In a case where an overcurrent occurs in the heating direction, the overcurrent is shunted into the thermo-module 5 and bypass line 21 as described above, and in comparison with a case where all the overcurrent flows into the thermo-module 5, the overcurrent flowing into the thermo-module 5 is partially relieved. Preferably, the resistance value of the resistor 22 is adequately established in compliance with specifications.

In the first embodiment, as described above, the substrate (the plate member 5*c*) of the thermo-module 5 at the side where a semiconductor laser element is disposed is thermally isolated from the sidewall of the package 4 and the optical fiber supporting member 12.

Figure 6A:
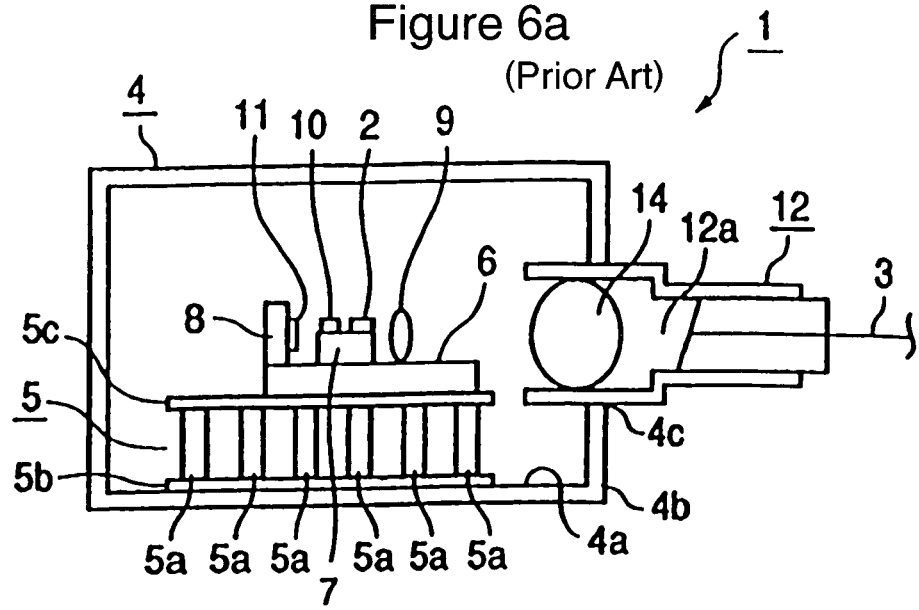
FIG. 6a is an explanatory view showing one structural example of a semiconductor laser module.
Figure 6B:
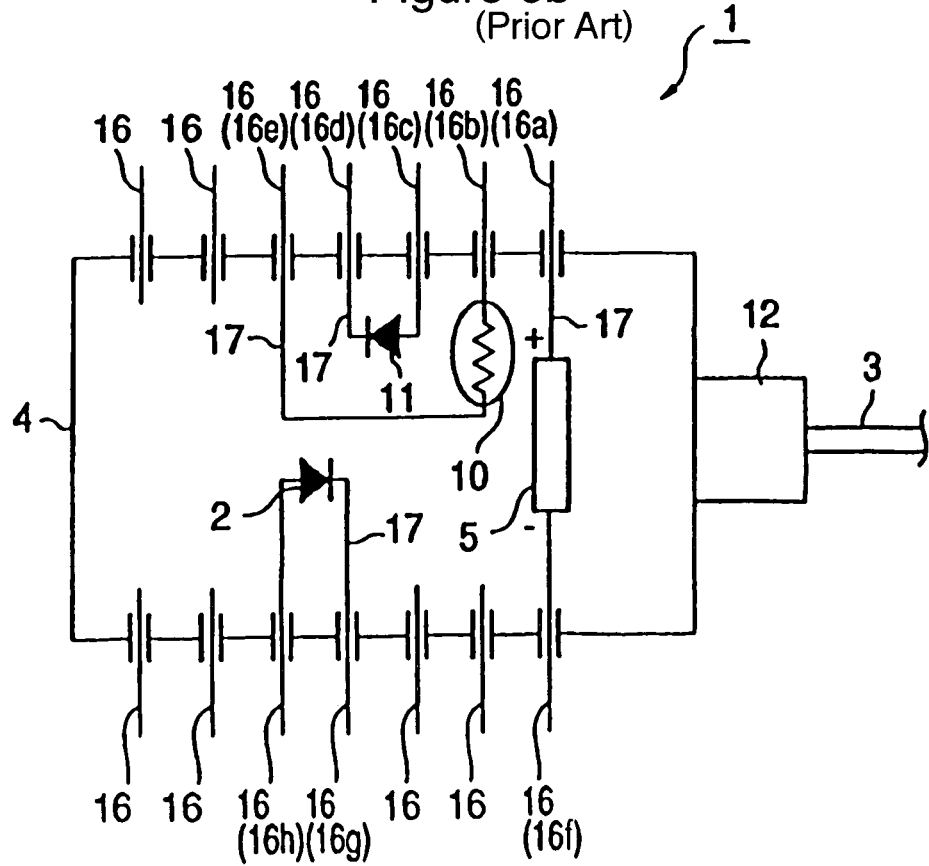
FIG. 6b is an explanatory view showing a prior art electric wiring example of the semiconductor laser module.

Therefore, in the circuit configuration of the prior art example shown in FIG. 6*b*, when an overcurrent flows to the thermo-module 5 in the heating direction, high temperature heating of the thermo-module 5 resulting from the overcurrent is not discharged to the outside of the package 4 via the sidewall thereof and the optical fiber supporting member 12, thereby leading to heat accumulation in components on the thermo-module 5 and likely to various problems arising there from.

In contrast in the first embodiment, the overcurrent limiting circuit 20 is provided, by which a reverse overcurrent flow to the thermo-module 5 in the heating direction is limited or at least reduced over prior art circuit design. Therefore, it is possible to evade various problems resulting from the overcurrent flow within the thermo-module 5 in the heating direction.

Since it is possible to suppress excessive heating of the thermo-module 5, which results from the overcurrent flowing in the heating direction, the semiconductor laser element 2 is prevented from being heated to a high temperature. Accordingly, the growth of defects in crystal of the semiconductor laser element 2 due to the high temperature heating can be prevented, whereby it is possible to prevent the characteristics of the semiconductor laser element 2 from deteriorating due to those defects.

In addition, it is possible to prevent a thermal fusion connecting material such as solder, by which a substrate 6 being a member for attaching a semiconductor laser element 2 and components such as lens 9, etc., is connected to the thermo-module 5, from being melted as a result of high temperature heating of the thermo-module 5; as such, it is possible to prevent the substrate 6 from shifting in position. Therefore, since the positional shift of the semiconductor laser element 2 and lens 9 with respect to the optical fiber 3 can be avoided, an optical decoupling (misalignment) between the optical fiber 3 and the semiconductor laser element 2 is avoided, thereby preventing a lowering of optical output.

Still further, it is possible to prevent generation of cracks at the joint between the lens 9 and metallic holder that is caused by a quick temperature rise at the substrate 5*c* side of the thermo-module 5. Thereby, it is possible to prevent dislodging of a lens 9 due to the generation of cracks and to avoid a situation where the optical coupling of the semiconductor laser element 2 and optical fiber 3 is disrupted.

Also, since it is possible to prevent solder between the Peltier element 5*a* and plate members 5*b* and 5*c* from melting, breakage of the thermo-module 5 itself can be avoided.

As described above, by providing an overcurrent limiting circuit 20, it is possible to prevent various problems from occurring due to an overcurrent flowing into the thermo-module 5 in the heating direction. Therefore, optical coupling, durability and reliability of a semiconductor laser module 1 is improved.

Figure 2:
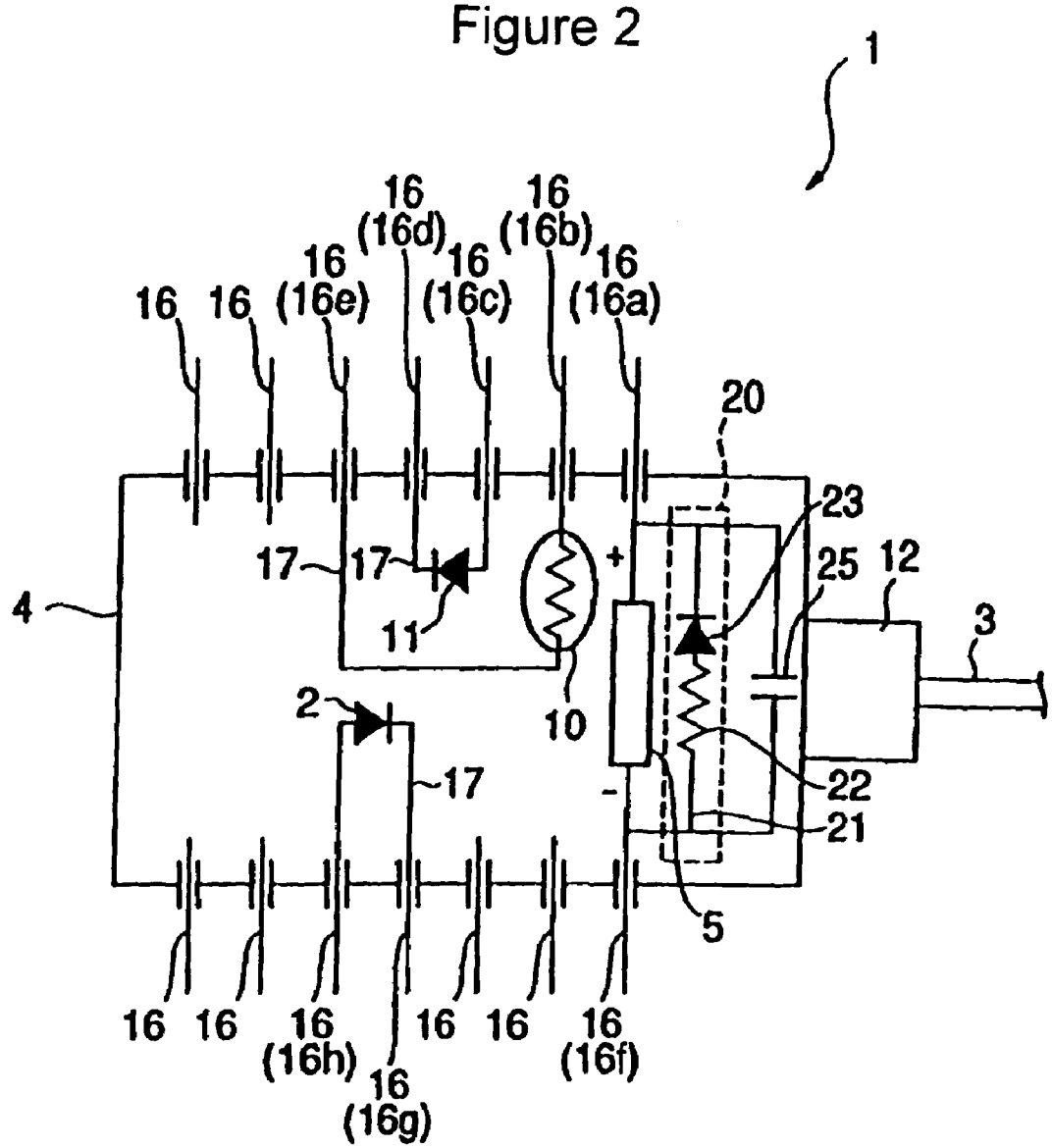
FIG. 2 is an explanatory view showing one example of electric wiring characteristic of a semiconductor laser module according to a second embodiment of the invention.

Hereinafter, a description is given of a second embodiment of the invention. A characteristic point at which the second embodiment differs from the above mentioned first embodiment resides in that, as shown in FIG. 2, a capacitor 25 for a surge current flow is provided in parallel to the thermo-module 5. The construction of the module other than this surge protector is similar to that of the first embodiment. In the following description of the second embodiment, parts which are identical to those in the first embodiment are given the same reference numbers, and overlapping description thereof is omitted.

In the second embodiment, as described above, since the capacitor 25 is provided in parallel to the thermo-module 5, little or no surge current, which is an instantaneous large current, flows into the thermo-module 5 since surge currents flow through the capacitor 25 when they occur. Therefore, it is possible to prevent the thermo-module 5 from being damaged due to any surge current flow therein.

The frequency of a surge current is high as it is an instantaneous pulse. The higher the frequency of a signal provided to a capacitor, the smaller the impedance thereof becomes. Therefore, even though a surge current is generated and provided to the thermo-module 5, almost all of the surge current flows through the capacitor 25 bypassing the thermo-module and thereby preventing the surge current from damaging the thermo-module 5. This alleviates much of the fear that components on the thermo-module 5 will be subjected to a quick temperature rise due to a surge current and prevents various problems as described above. The various problems that are avoided include deterioration of the characteristics of the semiconductor laser element 2, an optical decoupling between the semiconductor laser element 2 and the optical fiber 3, and disruption of the optical coupling due to a coming-off of a lens.

According to the second embodiment, as in the first embodiment, since an overcurrent limiting circuit 20 is provided, it is possible to limit a reverse overcurrent flow to the thermo-module 5 in the heating direction by the above mentioned overcurrent limiting circuit 20 as in the first embodiment whereby various problems arising from the overcurrent flow in the heating direction are prevented. Since the capacitor 25 is provided in parallel to the thermo-module 5, the capacitor 25 further prevents various problems from occurring due to a surge current flow.

In addition, the invention is not limited to the above-mentioned respective embodiments, but it may be subjected to various modifications or embodiments. For example, in the above mentioned respective embodiments, taking into consideration a case where a semiconductor laser module 1 is used not only at a temperature higher than room temperature but also at a lower temperature, it was assumed that the thermo-module 5 carries out not only a cooling action but also a heating action. Therefore, in order to feed a current to the thermo-module 5 in the heating direction, a resistor 22 was disposed in the bypass line 21. However, for example, where it is assumed that the semiconductor laser module 1 is used only at ambient temperature higher than normal, that is, where it is assumed that the thermo-module 5 carries out only a cooling action, there may be no need to provide the resistor 22.

In this case, the entire current in the heating direction will flow into the bypass line 21 having a diode 22 which functions as a reverse flow prevention means of the thermo-module 5, with almost no current flowing thereinto. Thereby, it is possible to surely prevent the overcurrent in the heating current from flowing in the thermo-module 5. Accordingly, it is possible to further securely avoid various problems due to an overcurrent flowing into the thermo-module 5 in the heating direction.

Figure 3:
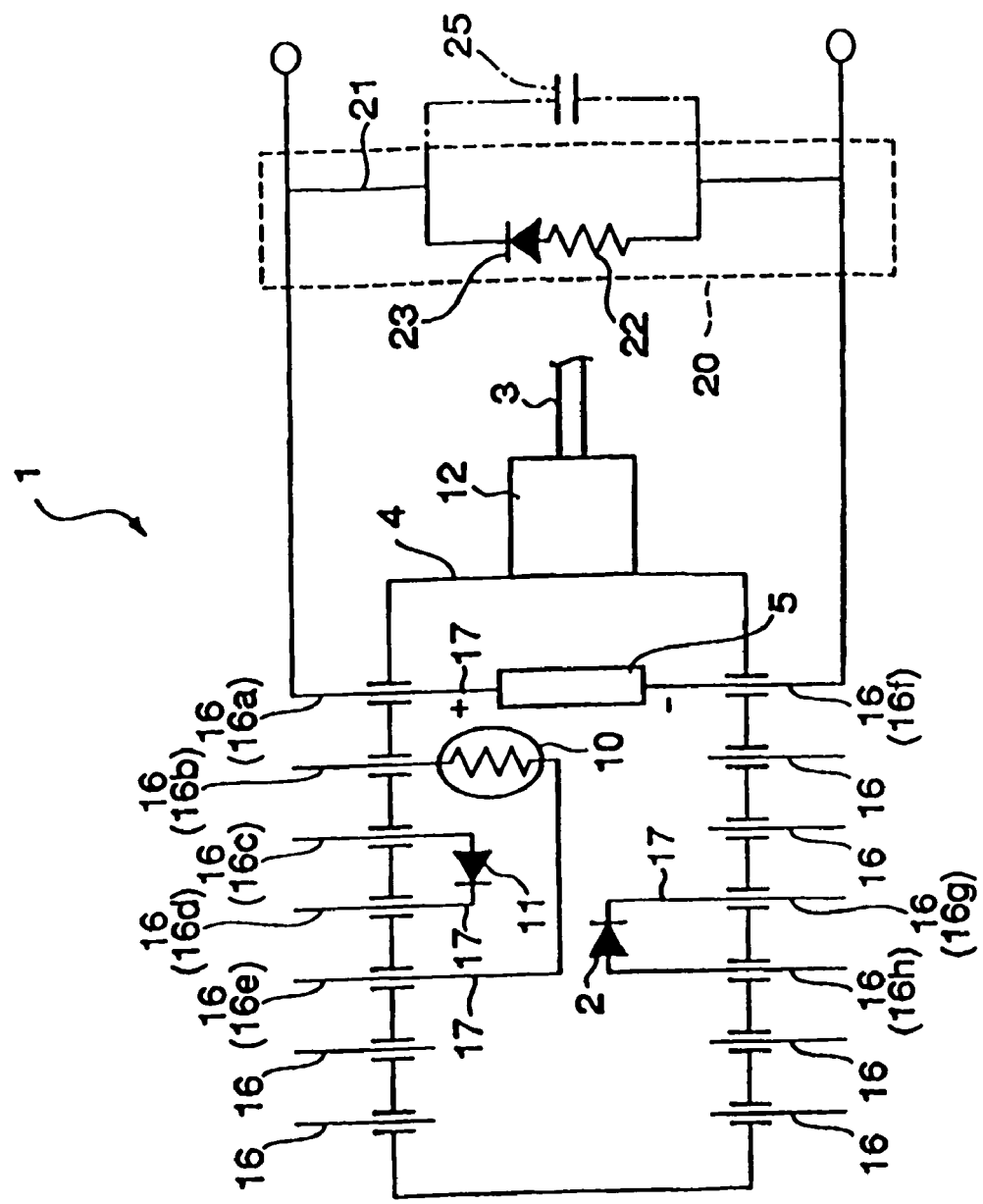
FIG. 3 is an explanatory view showing another structural example of a semiconductor laser module according to the invention.

Also, as in the above description, where it is assumed that the thermo-module carries out only a cooling action, and therefore it is not necessary to feed a current (reverse current) to the thermo-module 5 in the heating direction, a diode in which the current direction for cooling is made into a forward direction may be provided in series for the thermo-module 5 as a reverse current flow prevention means with no bypass line 21 provided. That is, it may be constructed so that the current flowing into the thermo-module 5 in the heating direction is completely prevented by the diode. Of course, another form of current limiting device is also useful with the present embodiment to form the current flow prevention means In addition, in the abovementioned respective embodiments, an example is illustrated of a semiconductor laser module with an overcurrent flow limiting feature, in which the abovementioned overcurrent limiting circuit 20 is provided in the package 4. However, for example, as shown in FIG. 3, an overcurrent limiting circuit 20 comprising a bypass line 21, a resistor 22, and a diode 23, which are covered by a dashed line in FIG. 3, maybe provided between a semiconductor laser module 1 having a similar construction to the prior art (construction shown in FIG. 6) and a drive controlling means for the semiconductor laser module, in order to drive the semiconductor laser module. Still further, a capacitor 25 similar to that in the second embodiment may be provided outside the semiconductor laser module 1 as shown with a dotted line in FIG. 3. An overcurrent limiting circuit 20 and a capacitor 25, which are provided outside the semiconductor laser module shown in FIG. 3, achieve functions similar to those of the overcurrent limiting circuit 20 and capacitor 25 illustrated in the abovementioned respective embodiments, and can bring about similar effects.

Also, in the embodiment, the overcurrent limiting means is not limited to an overcurrent limiting circuit 20 consisting of a bypass line 21, a resistor 22, and a diode 23 as illustrated in FIG. 3, but it can be achieved by other circuit means having similar functions or a software implementation. Further, it is needless to say that effects of the invention can be brought about by using as a drive power source of the Peltier module 5 a power source circuit (power source apparatus) equipped with similar functions.

A method for driving a semiconductor laser module according to the invention may be applicable to various types of transmission devices incorporating (or equipped with) a semiconductor laser module that controls the temperature of the semiconductor laser element by a Peltier element. In particular, since a semiconductor pumping laser module at the 1480 nm and the 980 nm band for use in a high output optical fiber amplifier generates much heat, at the semiconductor laser element, and is mostly used in high temperature environments, a current flown into the Peltier module to cool down the semiconductor laser element is very large. Therefore, a method for driving a semiconductor laser module according to the invention is favorable as a method for driving a semiconductor laser module in an optical fiber amplifier.

Figure 4:
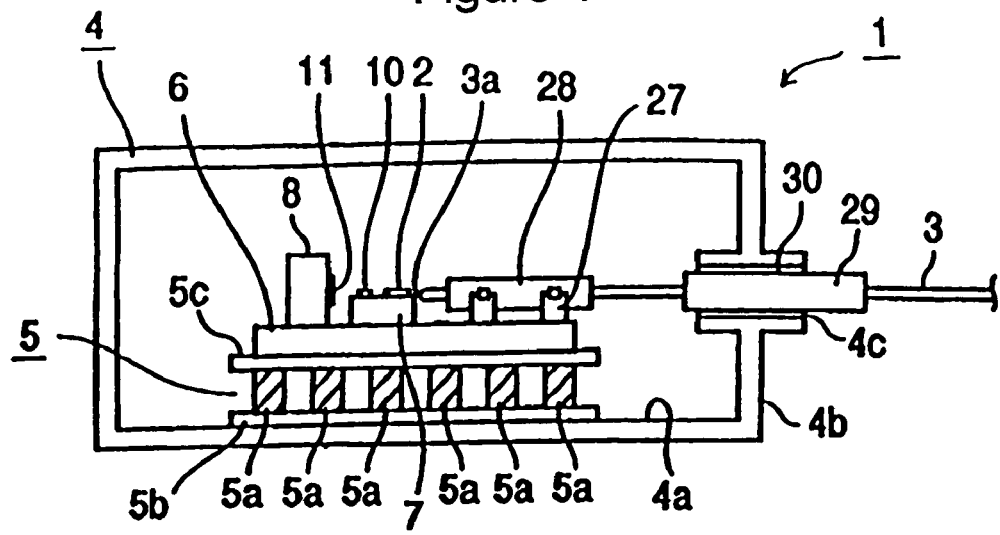
FIG. 4 is an explanatory view showing still another embodiment of the invention.

Further, in the abovementioned respective embodiments described above, although a coupling optical system is formed of discrete lenses 9 and 14 from the optical fiber 3 as shown in FIG. 6a, it may be formed of a lensed optical fiber 3 without utilizing the (discrete) lenses 9 and 14 as shown in FIG. 4. The lensed optical fiber 3 is an optical fiber having a lens 3a for focussing laser light emitted from a semiconductor laser element 2.

The lensed optical fiber 3 is incorporated in the semiconductor laser module 1 as described below. For example, as shown in FIG. 4, a fixing member 27, for example made of stainless steel, is attached to the substrate 6, and an optical fiber supporting member 28 is fixed at the fixing member 27 by YAG laser welding, etc. Also, another optical fiber supporting member 29 is fitted into and attached in a through hole 4c formed at the package 4 and is fixed therein by a connection material 30 such as PbSn solder, etc. The optical fiber supporting members 28 and 29 are, respectively, provided with a through hole though which an optical fiber 3 is introduced from outside of the package 4 into the inside thereof with the tip of the optical fiber and the semiconductor laser element 2 being disposed with an adequate spacing to be optically coupled to each other. Constructions other than the above are similar to those shown in FIG. 6a, and overlapping description thereof is omitted herein.

The optical fiber supporting members 28 and 29 are constructed of, for example, a thermally conductive material such as, for example, Fe—Ni—Co alloy, etc. Strictly speaking, in the construction shown in FIG. 4, a substrate (that is, a plate member 5c) of the thermo-module 5 at the side where the semiconductor laser element 2 is disposed is thermally connected to the optical fiber supporting member 29 via the optical fiber 3. But, since the optical fiber 3 is made of quartz glass having a very thin diameter of 125 μm or so, the quantity of heat transmitted from the plate member 5c of the thermo-module 5 to the optical fiber supporting member 29 via the optical fiber 3 is very slight.

Therefore, it can be regarded that the plate member 5c of the thermo-module 5 is thermally isolated from the abovementioned optical fiber supporting member 29. That is, the configuration shown in FIG. 4 is such that discharge of heat from the plate member 5c of the thermo-module 5 to the outside of the package 4 via the optical fiber supporting member 29 is limited. As described above, in a case where an electric wiring configuration shown in FIG. 6 is employed when discharge of the heat is limited, high temperature heat is accumulated in components on the thermo-module 5 and causes various problems if the thermo-module 5 is heated to an extraordinarily high temperature due to an overcurrent flow to the thermo-module 5. To the contrary, by providing the semiconductor laser module with a construction for suppressing an overcurrent flow to the thermo-module 5 as shown in the abovementioned respective embodiments, various problems resulting from the overcurrent flow to the thermo-module 5 can be effectively prevented from occurring.

Figure 5:
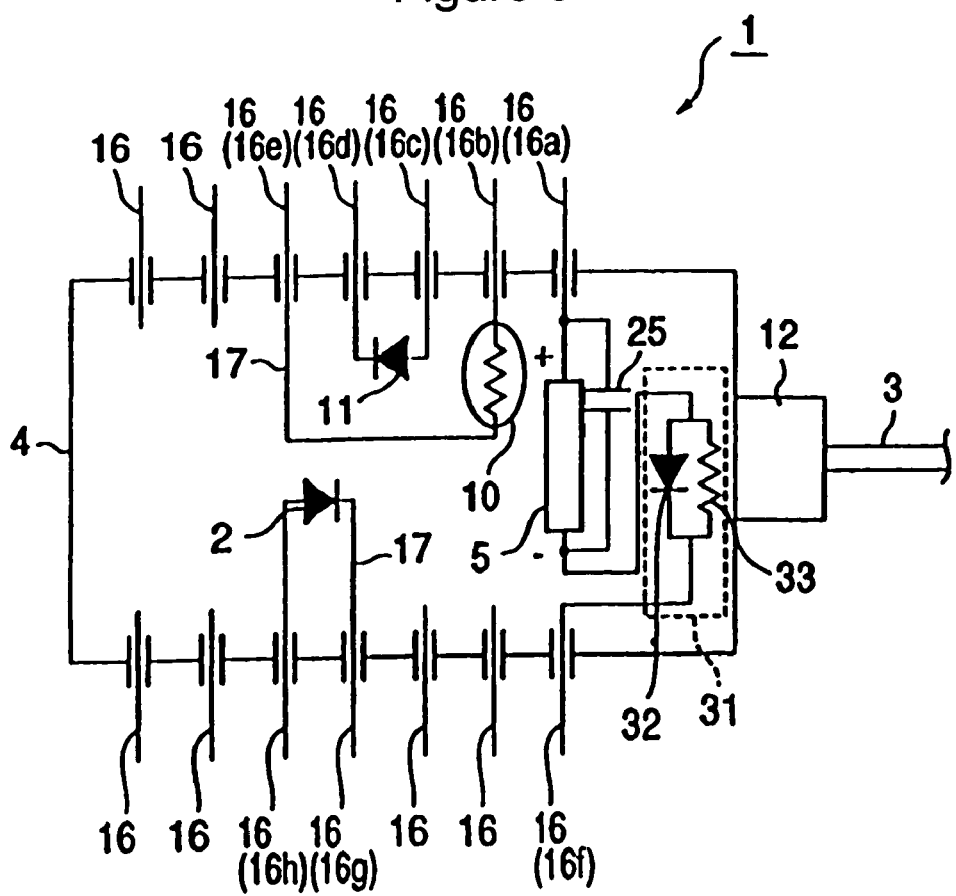
FIG. 5 is an explanatory view showing further another embodiment of the invention.

In addition, a construction shown in FIG. 5 is proposed as still another embodiment of the invention. The example shown in FIG. 5 does not correspond to current control with respect to the thermo-module 5, but it corresponds to voltage control with respect to the thermo-module 5. That is, with this construction, it is possible to avoid problems that result from the application of overvoltage to the thermo-module 5. That is, in FIG. 5, an overvoltage limiting means 31 is provided in series with respect to the thermo-module 5. The overvoltage limiting means 31 is composed of a parallel connection body consisting of a diode 32 in which the current flow direction in the cooling direction is made forward to be, and a resistor 33.

In the construction shown in FIG. 5, when voltage in the cooling direction is applied to the thermo-module 5, the diode 32 turns on, wherein almost no current flows into the resistor 33, while almost all current flows in the diode 32. Thereby, almost all voltage applied between the lead pins 16a and 16f is applied to the thermo-module 5.

Conversely, when voltage in the heating direction is applied to the thermo-module 5, the diode 32 turns off, wherein the current flows into the resistor 33, and the voltage applied between the lead pin 16a and 16f is divided to be applied to the thermo-module 5 and resistor 3. Based thereon, where overvoltage occurs between the lead pins 16a and 16f occurs, the overvoltage is divided to be applied to the thermo-module 5 and the resistor 33. Therefore, it is possible to relieve (limit) the overvoltage application onto the thermo-module 5, and to prevent various problems arising from the application of overvoltage to the thermo-module 5. Any one or both of such overvoltage limiting means and an overcurrent limiting means shown with respect to the abovementioned respective embodiments may be provided in a semiconductor laser module according to the invention.

Figure 7A:
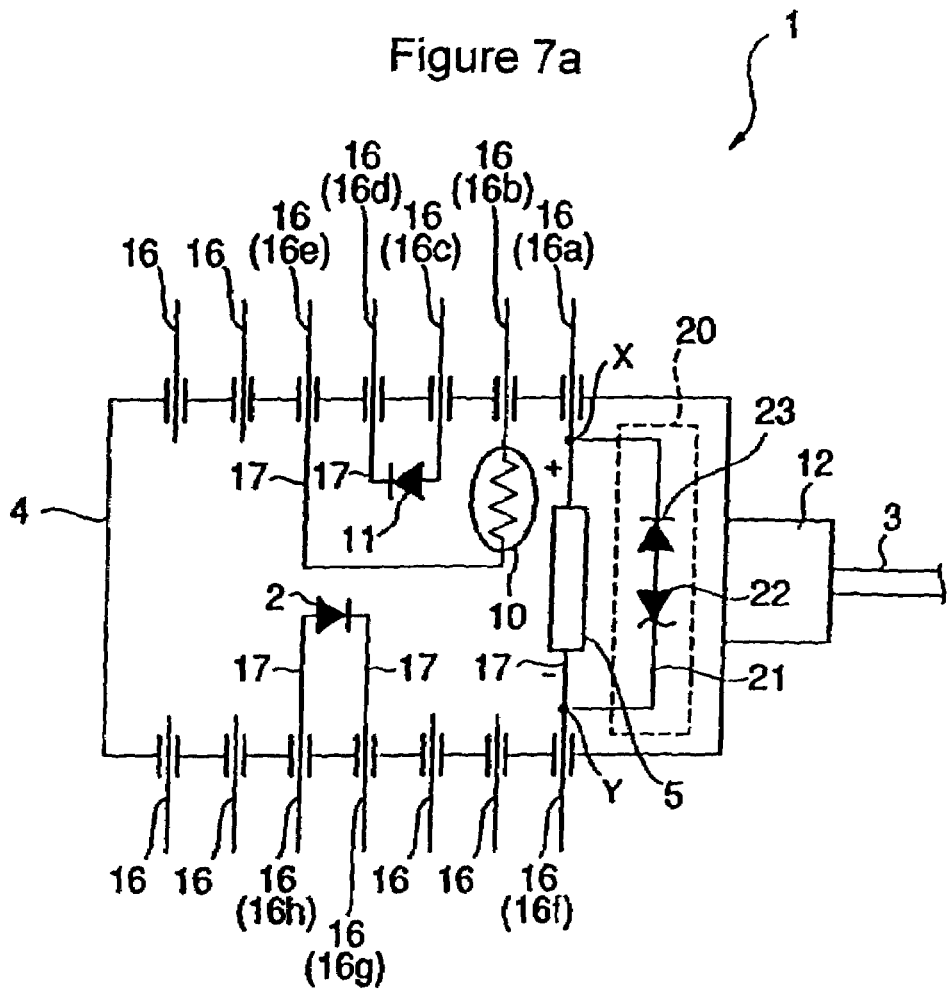
FIG. 7a explanatorily shows an electric wiring example of a featured semiconductor laser module in the first embodiment.

FIG. 7a shows an electric wiring example of a featured laser module according to the first embodiment.

As indicated in FIG. 7a, a featured structure in this first embodiment is to employ an overcurrent limiting circuit 20 in the form of an overcurrent limiting means. The overcurrent limiting circuit 20 is in the form of a bypass path 21, a zener diode 22, and a diode 23. The overcurrent limiting circuit acts to prevent electrical signals with excessively high voltage of improper polarity from damaging the thermo-module 5. In the embodiment shown, the diode 23 of the overcurrent limiting circuit 20 acts to prevent current from flowing in an incorrect direction thru the thermo-module 5. The zener diode 22 permits current associated with an electrical signal surge to bypass the thermo-module 5. Thus, the overcurrent limiting circuit 20 acts as a surge suppression circuit as well as a reverse current flow protection circuit.

Figure 7B:
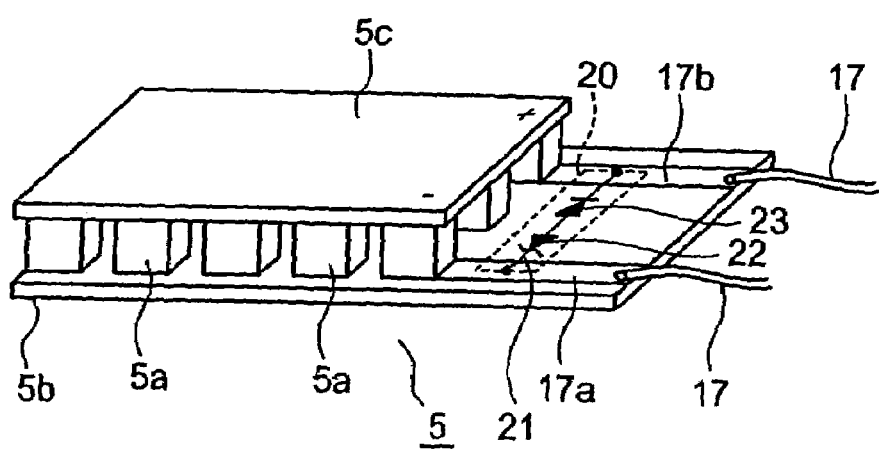
FIG. 7b is an explanatory diagram for illustratively indicating a perspective view of a structure of a thermo-module applied thereto.

A second feature in this embodiment is realized as indicated in FIG. 7b, the above-explained overcurrent limiting circuit 20 is assembled into a thermo-module 5, and this assembly is provided on a lower-sided board, namely on a plate member 5b in this embodiment.

The thermo-module 5 is formed on an upper-sided board, in this case, the plate member 5b is extended to an outer side, rather than the plate member 5c. Then, both a first conductor pattern 17a and a second conductor pattern 17b of the thermo-module 5 are formed on this extended portion. The overcurrent limiting circuit 20 is provided in such a manner that this overcurrent limiting circuit 20 bridges both the first conductor pattern 17a and the second conductor pattern 17b.

Both the conductor patterns 17a and 17b are formed by employing, for example, an "Au pattern", and are electrically connected to the Peltier-effect element 5a. Also, as indicated in FIG. 7a, the conductor patterns 17a and 17b are connected via conducting means 17 to lead pins 16, respectively.

It should be noted that since structures of the semiconductor laser module 1 of the present embodiment other than the above-explain structural elements are similar to those of the conventional semiconductor laser module shown in FIG. 6, the same reference numerals shown in FIG. 6 will be employed as those for denoting the same, or similar structural elements of the first semiconductor laser module 1, and therefore, descriptions thereof are omitted.

The thermo-module 5 executes the operation along the heating direction. Typically, the thermo-module 5 drives alternatively heating operation and the cooling operation in response to the direction of the current supply, and furthermore, controls the temperature of the semiconductor laser element 2 in response to the amount of the supplied current.

Then, in accordance with this first embodiment, the semiconductor laser module 1 is arranged as follows: In the case that a current is supplied from the lead pin 16f to the lead pin 16a shown in FIG. 7a, the thermo-module 5 executes the heating operation. Conversely, when a current is supplied from the lead pin 16a to the lead pin 16f, the thermo-module 5 executes the cooling operation.

In FIG. 7a, one end side of the above-explained bypass path 21 is connected to a point "X" located on the side of the lead pin 16a rather than the thermo-module 5, and the other end side of this bypass path 21 is connected to a point "Y" located on the side of the led pin 16f rather than the thermo-module 5. With employment of this structure, the bypass path 21 short circuits both an upper stream side "Y" of the thermo-module 5 and a lower stream side "X" thereof in the current path for the thermo-module 5 along the heating direction, while detouring this thermo-module 5.

Figure 8A:
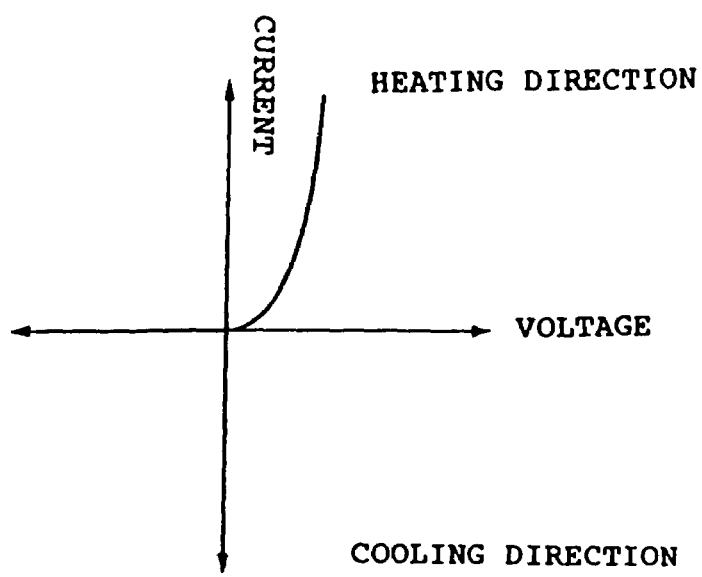
FIG. 8a is an explanatory diagram for explaining operation of a diode 23 employed in the first embodiment.

The diode 23 is disposed in the bypass passage 21 with its forward direction being in the heating direction. As shown in FIG. 8a, therefore, the diode 23 is turned ON when the electric current flows in the heating direction of the thermo-module 5 but OFF when the electric current flows in the cooling direction of the thermo-module 5.

Figure 8B:
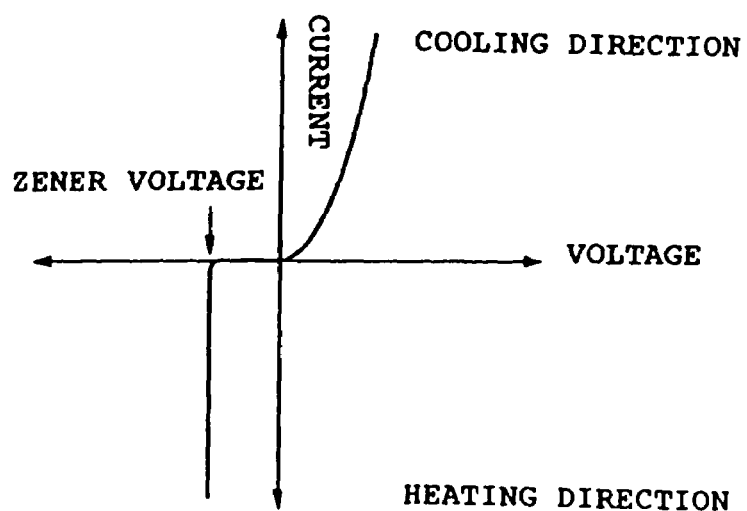
FIG. 8b is an explanatory diagram for explaining operation of a zener diode 22 employed in the first embodiment.

On the other hand, the Zener diode 22 is oriented oppositely relative to the diode 23. Therefore, the Zener diode 22 is turned ON, as shown in FIG. 8b, when the electric current flows in the cooling direction of the thermo-module 5. In the first embodiment, however, the Zener diode 22 is connected in series with the diode 23 so that the overcurrent limiting circuit 20 is OFF when the electric current in the cooling direction flows in the thermo-module 5.

In the above embodiments employing Zener diodes, the overcurrent limiting circuit 20 is OFF normally even when the thermo-module 5 acts in the heating direction. When the overcurrent flows in the heating direction, both the diode 23 and the Zener diode 22 act to shunt the electric current in the heating direction into the bypass passage 21 so that the overcurrent in the heating direction flowing into the thermo-module 5 is reduced or limited.

When a current flows through the thermo-module 5 in the heating direction, the zener diode 22 remains in the OFF state until a predetermined voltage appears across the thermo-module 5, namely the voltage reaches to a known threshold value of the zener diode 22. Then, the zener diode 22 becomes active.

As a consequence, the semiconductor laser module 1 is arranged as follows: Even when the thermo-module 5 is operated for heating, under normal conditions, when no overcurrent occurs, the overcurrent limiting circuit 20 maintains the OFF state. In such a case that the overcurrent happens to occur along the heating direction, the diode 23 enters an ON state and the zener diode 22 becomes active. As a result, the current-flowing in the heating direction may be shunted into both the thermo-module 5 and the bypass path 21, and it is possible to suppress the overcurrent flowing in the heating direction within the thermo-module 5.

Circuit operation of the above-described overcurrent limiting circuit 20 will now be simply explained. The semiconductor laser module 1 is electrically connected to the drive controller for driving the semiconductor laser module by using the lead pins 16. When a current flowing along a direction from the lead pin 16a to the lead pin 16f by which the thermo-module 5 is driven in the cooling operation mode is supplied, the diode 23 of the overcurrent limiting circuit 20 is brought into the OFF state (non-conductive state). As a result, the current flowing along the cooling direction is not supplied to the bypass path 21, but the entire current flows into the thermo-module 5.

Conversely, when a current (herein referred to as a reverse current) flows from the lead pin 16f to the lead pin 16a by which the thermo-module 5 is driven in the heating operation mode is supplied, the diode 23 of the overcurrent limiting circuit 20 is brought into the ON state (conductive state). However, this diode 23 is maintained in an OFF state (non-conductive state) until the voltage between both ends of the zener diode 22 exceeds the threshold value (zener voltage) of the zener diode 22. As a result, absent overcurrent flowing in the heating direction, the current flowing in the heating direction is not supplied to the bypass path 21 and the entire current in the heating direction flows into the thermo-module 5.

Then, when the overcurrent flowing in the heating direction occurs, the current flowing in the heating direction is shunted into both the thermo-module 5 and the bypass path 21. As a result, it is not possible to suppress the supply of this overcurrent to the thermo-module 5.

As previously explained, in this first embodiment, the plate member 5c on which the semiconductor laser element 2 of the thermo-module 5 is arranged is thermally and independently provided with respect to the side wall of the package 4 and the optical fiber supporting member 12. As a result, there is no possibility such that the high temperature produced from the components on the thermo-module 5 are radiated via the side wall of the package 4 and the optical fiber supporting member 12 outside the package 4 when the overcurrent is supplied to the thermo-module 5. As a consequence, substantially all of the heat of the thermo-module 5 resulting from the overcurrent are transferred to the components provided on the thermo-module 5 and stored therein. As a result, the temperature of the components provided on the thermo-module 5 are conspicuously increased, and therefore, the following events may easily happen causing a serious problem.

Conversely, in the present embodiment, while the overcurrent limiting circuit 20 is provided, this overcurrent limiting circuit 20 may relax, or reduce the supply of the overcurrent to the thermo-module 5 in the heating direction. As a result, it is possible to avoid occurrences of the below-mentioned various problems which are caused by supplying the overcurrent to the thermo-module 5 along the heating direction.

That is, since the overcurrent limiting circuit 20 suppresses abnormal heating of the thermo-module 5 caused by the overcurrent, it is possible to prevent the semiconductor laser element 2 from being heated to a high temperature thereby avoiding the above noted problems. As a result, reliability and component durability of the semiconductor laser module 1 can be considerably improved.

Also, in accordance with the present embodiment, the overcurrent limiting circuit 20 is arranged by providing the bypass path 21, the diode 23, and the zener diode 22. Until the voltage across the zener diode 22 reaches the zener voltage of the zener diode 22, control of the thermo-module 5 is similar for both heating and cooling. As a result, both the cooling operation and the heating operation of the thermo-module 5 can be freely controlled in a proper manner. Moreover, as previously described, it is possible to arrange such a semiconductor laser module having the advantageous characteristic that it is capable of suppressing overcurrent flowing in at least one direction.

Moreover, in accordance with the first embodiment, while the overcurrent limiting circuit 20 is assembled on the thermo-module 5 and then the assembled module is provided on the plate member 5b of the thermo-module 5, both the diode 23 and the zener diode 22 which constitute the overcurrent limiting circuit 20 are disposed lower than the semiconductor laser element 1. As a result, it is possible to prevent either the diode 23 or the zener diode 22 interrupting the optical path of the light emitted from the semiconductor laser element 2.

Also, in accordance with the present embodiment, since the overcurrent limiting circuit 20 is previously assembled on the plate member 5b of the thermo-module 5, the assembling work of the semiconductor laser module 1 can be carried out very efficiently, compared to a situation where the overcurrent limiting circuit 20 is directly connected to the conductor terminal 36.

Another embodiment will be described below. This other embodiment is characterized in that a surge current feeding capacitor 25 is connected in parallel with the thermo-module 5, as shown in FIG. 9. The remaining constructions are similar to those of the first embodiment. In the description of the present embodiment, the repeated description of the same construction parts as those of the first embodiment will be omitted by designating them by the common reference numerals.

In this embodiment, the capacitor 25 is connected in parallel with the thermo-module 5, as described above. An instantaneous high current or a surge current flows through the capacitor 25 and not through the thermo-module 5. This is because of the nature of capacitors. As a result, it is possible to prevent damage to the thermo-module 5, as might otherwise be caused by the surge current feed.

According to this embodiment, there is provided the overcurrent limiting circuit 20, as in the foregoing embodiment. By this overcurrent limiting circuit 20, therefore, overcurrent in the heating direction provided to the thermo-module 5 is suppressed or limited. In addition, the capacitor 25 is connected in parallel with the thermo-module 5 and the overcurrent limiting circuit 20 to prevent problems associated with current surges. Alternatively, this zener diode 22 is omitted, and/or a resistor 26 is provided in its place.

Figure 10:
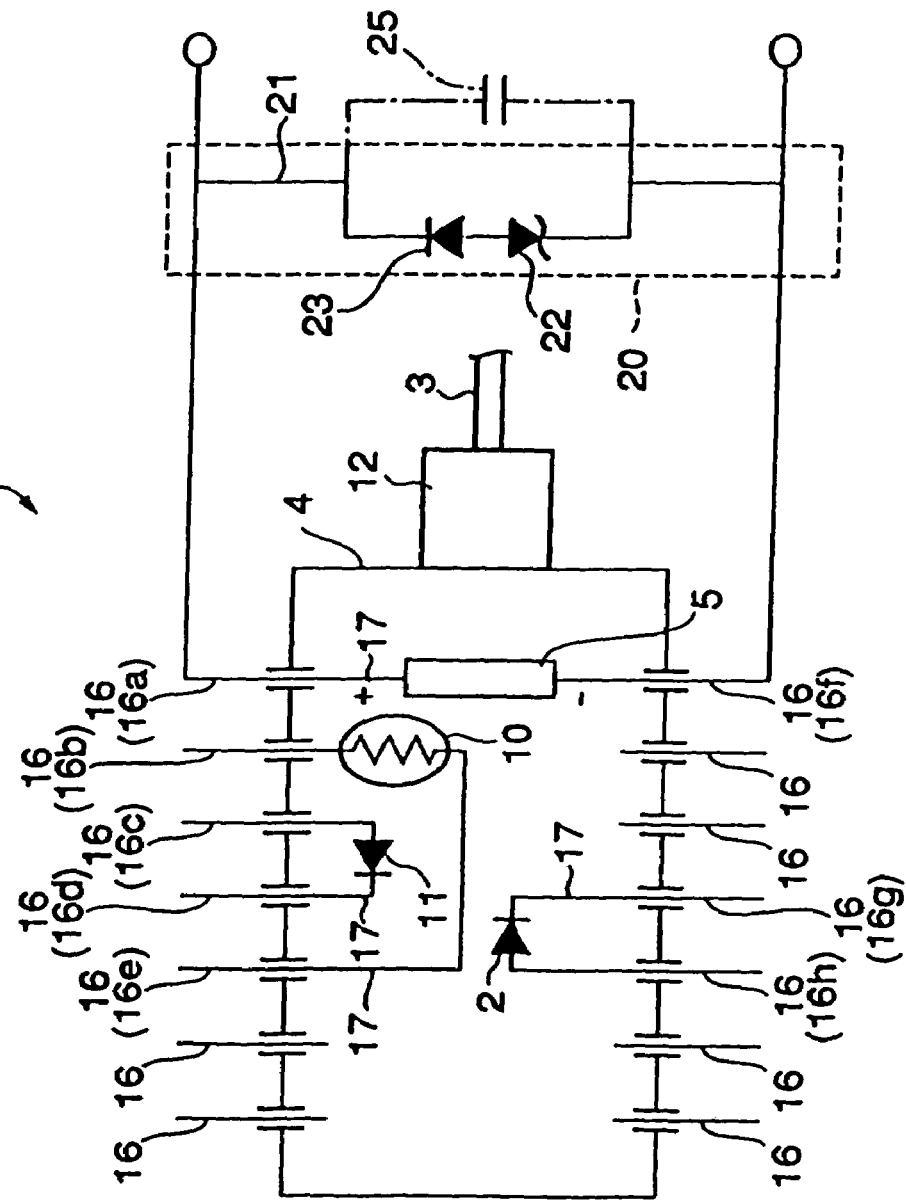
FIG. 10 is an explanatory diagram for indicating an electric wiring example of another embodiment.

The present invention should not be limited to the aforementioned individual embodiments but can take various modes of embodiment. These embodiments have been exemplified by the semiconductor laser module having an overcurrent limiting feature, in which the overcurrent limiting circuit 20 is disposed, for example, within the package 4. However, the invention may be modified, as shown in FIG. 10, such that the overcurrent limiting circuit 20 composed of the bypass passage 21, the Zener diode 22 and the diode 23 and enclosed by dotted lines in FIG. 10 is connected between the semiconductor laser module 1 having a construction similar to that of the prior art and the drive control means for the semiconductor laser module, thereby to drive the semiconductor laser module.

Moreover, the capacitor 25 similar to that of the previous embodiment may be disposed outside of the semiconductor laser module 1, as shown by dotted lines. The overcurrent limiting circuit 20 and the capacitor 25, as disposed outside of the semiconductor laser module 1 shown in FIG. 4, can perform functions similar to those of the overcurrent limiting circuit 20 and the capacitor 25, as presented in the foregoing individual embodiments, and can achieve effects similar to those of the foregoing individual embodiments.

Figure 11:
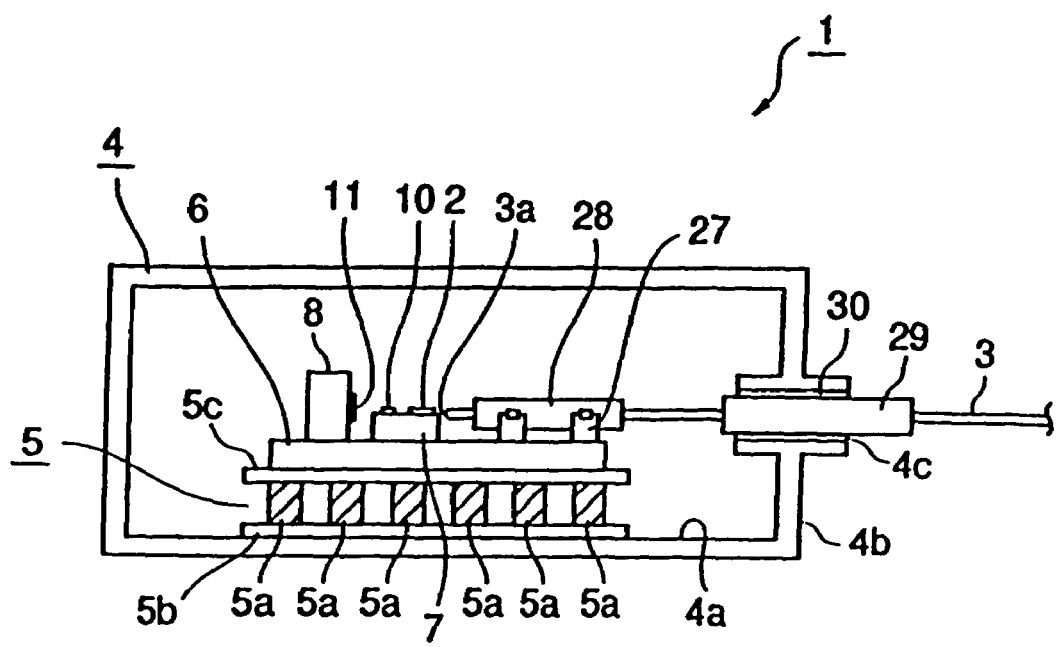
FIG. 11 is an explanatory diagram for showing a further embodiment by way of a sectional view thereof.

In the foregoing individual embodiments, the coupling optical system is formed by using the lenses 9 and 14 different from the optical fiber 3, as shown in FIG. 6a. As shown in FIG. 11, however, an optical fiber 3 having a lens may be used to construct the coupling optical system. This optical fiber 3 is equipped with the lens 3a for converging the laser beam emitted from the semiconductor laser element 2.

The fiber 3 is assembled in the semiconductor laser module 1, as shown in FIG. 5. For example, there are mounted on the substrate 6 a plurality of fixing members 27 formed, for example, of stainless steel that fix an optical fiber supporting member 28 by the YAG laser welding means or the like. In a through hole 4c formed in the package 4, on the other hand, there is fitted and fixed an optical fiber supporting member 29 by a jointing material 30 such as PbSn solder. Those optical fiber supporting members 28 and 29 are individually provided with the insert holes, into which the optical fiber 3 is introduced so far from the outside of the package 4 that it is arranged at a suitable spacing for optically coupling its leading end and the semiconductor laser element 2. The remaining construction is similar to the aforementioned construction shown in FIG. 6a so that details thereof are omitted.

The aforementioned optical fiber supporting members 28 and 29 are made of a thermally conductive material such as a Fe—Ni—Co alloy. In the construction shown in FIG. 11, the substrate (i.e., the sheet member 5c) of the thermo-module 5 on the arrangement side of the semiconductor laser element 2 is thermally connected to the optical fiber supporting member 29 strictly through the optical fiber 3. This optical fiber 3 is made of quartz having a diameter as small as about 125 microns. The heat that is transferred from the sheet member 5c of the thermo-module 5 through the optical fiber 3 to the optical fiber supporting member 29 is very little.

As a result, the sheet member 5c of the thermo-module 5 is substantially thermally independent of the optical fiber supporting member 29. In other words, this construction shown in FIG. 11 is made such that there is restricted the release of the heat from the sheet member 5c of the thermo-module 5 through the optical fiber supporting member 29 to the outside of the package 4.

This construction is accompanied, as described above, by the various problems because a high heat is stored in the parts on the thermo-module 5 when this thermo-module 5 is heated to an abnormally high temperature by the overcurrent flow into the thermo-module 5. With the embodiments for suppressing the overcurrent feed to the thermo-module 5 disclosed in the foregoing individual embodiments, it is possible to solve effectively the problems, as might otherwise be caused by the overcurrent feed to the thermo-module 5.

Figure 12:
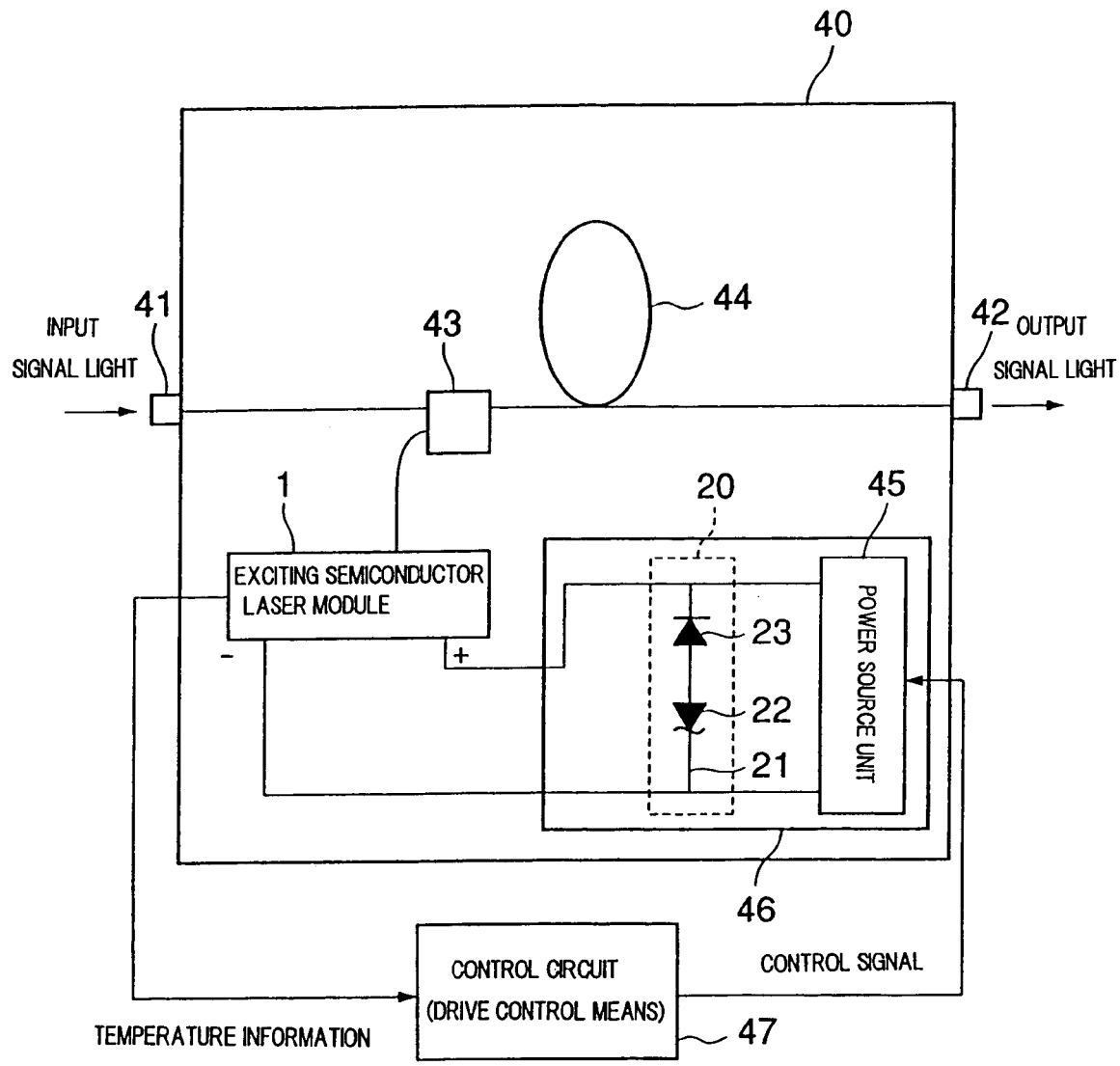
FIG. 12 is an explanatory diagram showing one embodiment of a communication device according to the invention.

FIG. 12 shows an optical fiber amplifier exemplifying the communication device of the invention. This optical fiber amplifier 40 is constructed to include: a signal light input unit 41 for inputting a light signal; an EDF 44 (Erbium-Doped Fiber) for amplifying the light signal; a signal light output unit 42 for outputting the amplified light signal; the pumping semiconductor laser module 1 for pumping the EDF 44; and a power source circuit 46 to be controlled by a control circuit 47 acting as drive controller.

The power source circuit 46 is constructed to have: a power source unit 45 for feeding electric power to the semiconductor laser module 1; and the overcurrent limiting circuit 20 connected in parallel with the power source unit 45 and the semiconductor laser module 1. The overcurrent limiting circuit 20 comprises, for example, the bypass passage 21, the Zener diode 22 and the diode 23. Here, reference numeral 43 appearing in FIG. 12 designates an optical coupler functioning as an optical wavelength multiplexer/demultiplexer.

Here is described the operation of the optical fiber amplifier 40. From the signal light input unit 41, there is input the light signal having a band of 1,550 nm, for example, which is input through the optical coupler 43 to the EDF 44. The semiconductor laser module 1 produces a light having a band of 980 nm or 1,480 nm and feeds the light through the optical coupler 43 to the EDF 44. This EDF 44 is brought into such an excited state by the pumping light provided from the semiconductor laser module 1 as to amplify the power of the light signal propagating within the EDF. The light signal thus amplified by the EDF 44 is provided from the signal light output unit 42.

Here, temperature information on the inside of the pumping semiconductor laser module 1 is provided to the control circuit 47 at frequent intervals so that the control circuit 47 generates a control signal on the basis of the temperature information. This control signal is provided to the power source unit 45 so that the power source unit 45 acts on the basis of the control signal to feed the electric power to the thermo-module (not shown in FIG. 12) in the semiconductor laser module 1 thereby to keep the temperature in the semiconductor laser module 1 at a constant level.

In the optical fiber amplifier 40, as in the cases relying on a zener diode within the overcurrent limiting circuit 20, the bypass path is OFF—no current flows therethrough when the electric current flows in the cooling direction of the thermo-module of the semiconductor laser module 1. When an overcurrent flows in the heating direction of the thermo-module, however, the overcurrent limiting circuit 20 is turned ON, at least when needed.

Thus, it is possible to suppress the feed of the overcurrent to the thermo-module of the semiconductor laser module 1. Therefore, reduction of the optical output intensity from the semiconductor laser module 1 is prevented due to heat related damage. Thus, the optical fiber amplifier 40 amplifies the light signal in a stable fashion.

Here, the semiconductor laser module according to the invention and its drive method and communication device can be applied to any device that is provided with a semiconductor laser module having a thermo-module for temperature control. Especially in a semiconductor laser module having a wavelength band of 980 nm or 1,480 nm to be employed in the aforementioned optical fiber amplifier.

Therefore, the invention solves problems characteristic to deterioration of the semiconductor laser element due to the abnormal heating of the thermo-module, problems of the optical coupling misalignment, problems of the optical coupling loss, and problems of failure of the thermo-module due to lens misalignment.

In the semiconductor laser module of an embodiment of the invention, the overcurrent limiting circuit comprises the bypass passage, the diode and the Zener diode so that the control of the thermo-module in the heating direction is analogous to control in the cooling direction until the voltage between the two ends of the Zener diode reaches the threshold value set for the Zener diode. Therefore, it is possible to provide an excellent semiconductor laser module having controlled the cooling action and heating action by a thermo-module while suppressing the overcurrent.

It should be understood that the present invention is not limited only to the above-explained first and second embodiments, but may be realized by employing various different embodiments. In each of the above-explained embodiments, the plate member 5b of the thermo-module 5 is formed in the extended form, and the overcurrent limiting circuit 20 is assembled in the thermo-module 5. Alternatively, while the overcurrent limiting circuit 20 is not assembled into the thermo-module, this overcurrent limiting circuit 20 may be provided on either the plate member 5b, or on the bottom plate 4a of the package 4. In this alternative case, it is also possible to avoid such a problem that the diode 23, the zener diode 22, and the resistor 26, which constitute the overcurrent limiting circuit 20, may interrupt the optical path of the semiconductor laser element 2.

Also, in the respective embodiments, considering such a condition that the semiconductor laser module 1 is used not only under temperature environments higher than, or equal to the normal temperature, but also under temperature environments lower than this normal temperature, it is so conceived that the thermo-module 5 is operable not only in the cooling mode, but also the heating mode. To this end, in order to supply the current to the thermo-module 5 along the heating direction, both the zener diode 22 and the resistor 26 are inserted in the bypass path 21.

Figure 13A:
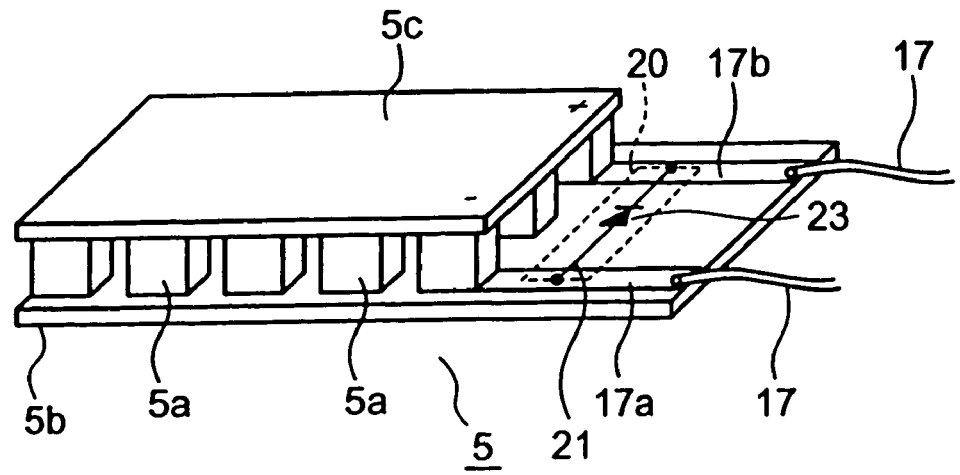
FIG. 13a is a perspective view for indicating a structure of a thermo-module applied to another embodiment.
Figure 13B:
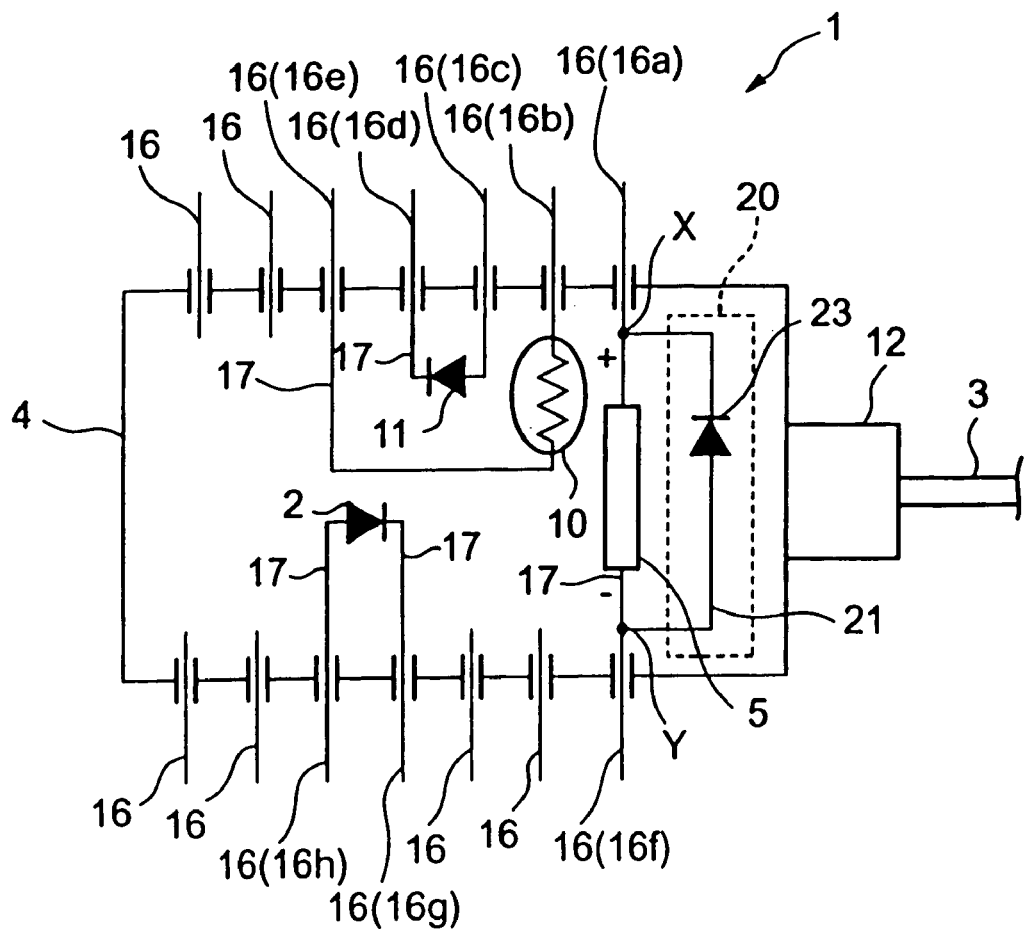
FIG. 13b is an explanatory diagram for explaining an electric wiring example thereof.

However, for instance, in such a case that the semiconductor laser module 1 is used only within a temperature environment higher than or equal to the normal temperature, namely the thermo-module 5 is operated only in the cooling mode, for instance, as shown in FIG. 13b, such a diode whose forward direction is selected to the current direction of the cooling operation may be series-connected to the thermo-module 5 so as to construct the overcurrent limiting circuit 20. In other words, the supply of the entire portion of the current to the thermo-module 5 in the heating direction may be blocked.

Figure 14A:
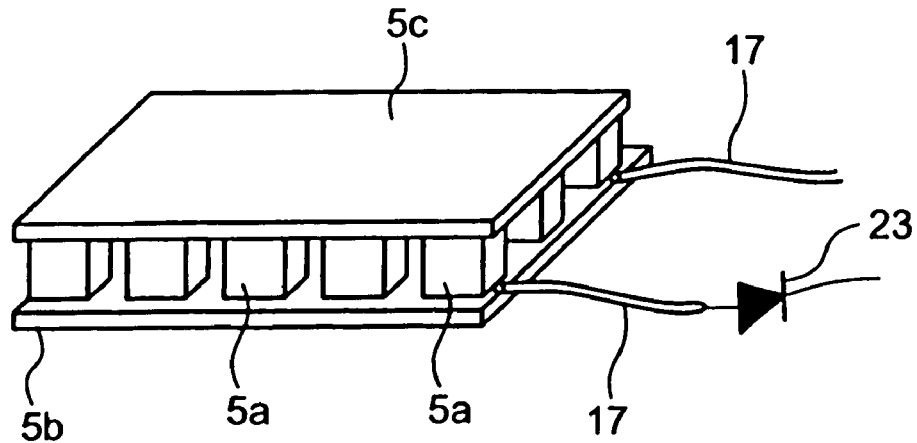
FIG. 14a is a perspective view for indicating a structure of a thermo-module applied to a further embodiment.
Figure 14B:
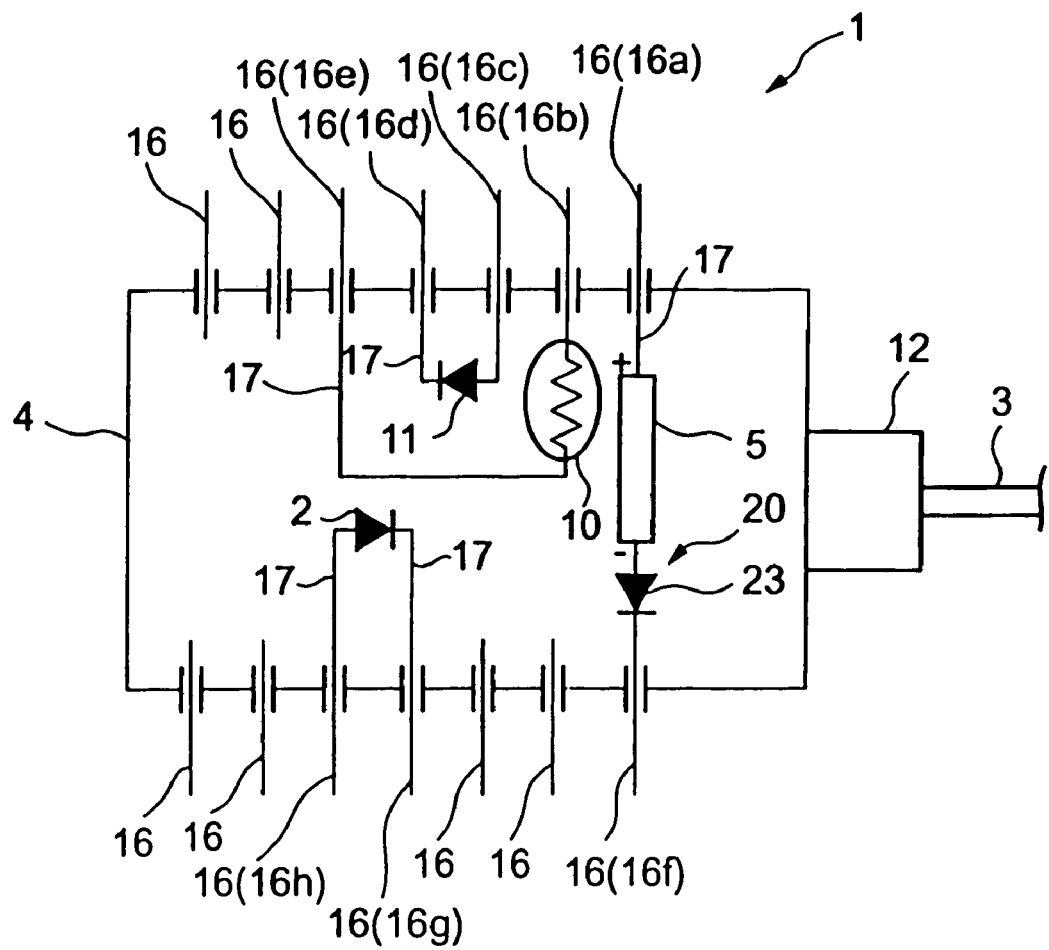
FIG. 14b is an explanatory diagram for explaining an electric wiring example thereof.
Figure 15:
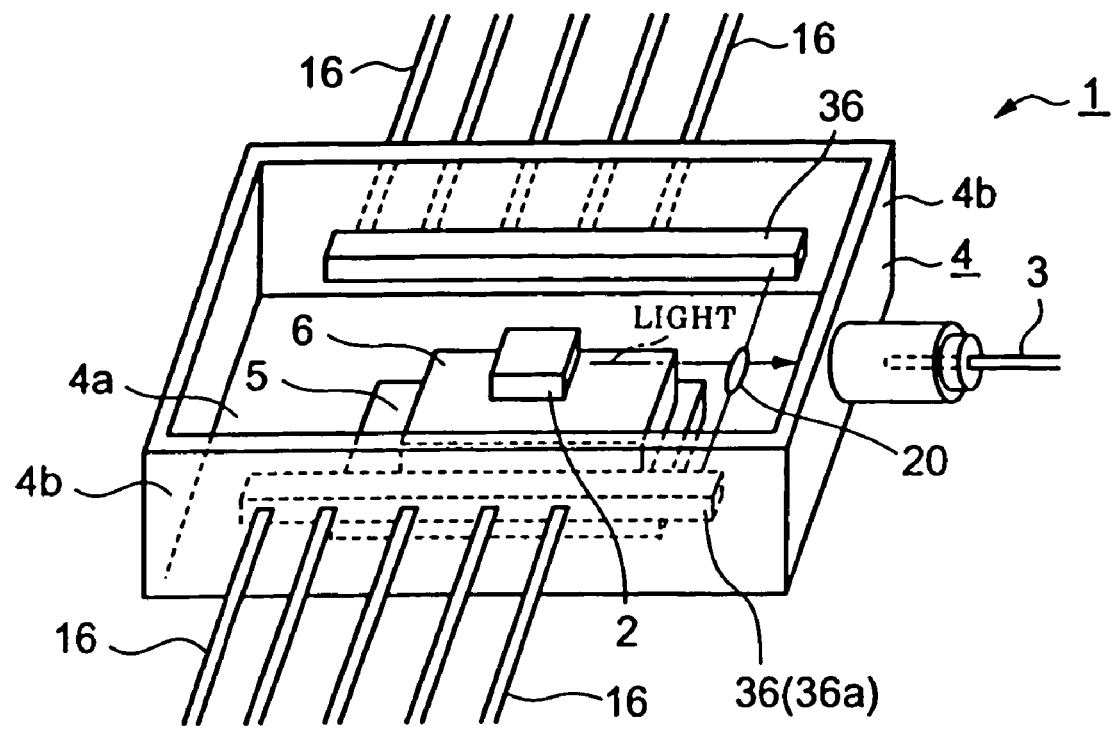
FIG. 15 is an explanatory diagram for schematically indicating the package structure of the conventional laser module and the structural example within this package.

In this alternative case, as indicated in FIGS. 14A and 14B, one end side of the diode 23 is connected via the conducting means 17 to the thermo-module 5. Then, the other end side of this diode 23 is connected to the conductor terminal 36 (namely, on the arranging side of diode 23, for example, conductor terminal 36a of FIG. 15) which is formed on the side wall of one side of the conductor terminal 36 which is formed on both side walls 4b of the package 4.

As explained above, when the diode 23 is provided on the side of one conductor terminal 36 in such a manner that this diode 23 does not bridge the conductor terminals 36 formed on both side walls 4b of the package 4, it is possible to avoid a condition wherein the diode 23 interrupts the optical path of the semiconductor laser element 1.

In addition, in the above-explained embodiments, the thermo-module 5 is provided in the semiconductor laser module 1. However, the thermo-module of the present invention is not necessarily applied to the semiconductor laser module, but may be properly applied to various apparatuses, for instance, such a passive module that a temperature control is carried out by the thermo-module.

In accordance with the semiconductor laser module of the present invention, while the overcurrent limiting circuit is provided inside, or outside the semiconductor laser module, the supply of the overcurrent to the thermo-module is limited by this overcurrent limiting circuit. Since such an arrangement is employed, this semiconductor laser module avoids problems caused by supplying the overcurrent to the thermo-module.

As described above, a semiconductor laser module and a method for driving the semiconductor laser module according to the invention is capable of preventing the semiconductor laser and its related components from deteriorating or being damaged, circuit operations from becoming unstable, and the optical system from the semiconductor laser to an optical fiber from misaligning, all of which result from excessive heating, etc., by suppressing overcurrent and overvoltage. Therefore, they are suitable as a means for carrying out highly reliable optical transmissions.

Numerous other embodiments may be envisaged without departing from the spirit or scope of the invention.

What is claimed is:

1. A semiconductor laser module comprising:
   a semiconductor laser element;
   an optical fiber optically coupled for receiving laser light emitted from the semiconductor laser element;
   a thermo-module for adjusting the temperature of the semiconductor laser element in dependence upon an amount of current flowing into said thermo-module, said thermo-module configured to support the semiconductor laser element via solder; and,
   at least one of an overcurrent limiting circuit to suppress an overcurrent flowing into the thermo-module and an overvoltage limiting circuit to suppress application of an overvoltage across said thermo-module, said at least one of the overcurrent limiting circuit and the overvoltage limiting circuit being configured to serve as a surge suppresion circuit for preventing surge current oriented for causing melting of the solder from flowing into said thermo-module.

2. A semiconductor laser module comprising:
   a semiconductor laser element;
   an optical fiber optically coupled for receiving laser light emitted from the semiconductor laser element;
   a thermo-module for adjusting the temperature of the semiconductor laser element in dependence upon an amount of current flowing into said thermo-module, said thermo-module configured to support the semiconductor laser element; and,
   an overcurrent limiting circuit to suppress an overcurrent flowing into the thermo-module,
   wherein the overcurrent limiting circuit includes:
      a diode disposed serially to the thermo-module and oriented for allowing current to flow therethrough when the flowing current is oriented in a direction for causing cooling of the semiconductor laser element; and
      a current limiting circuit element coupled in parallel to the thermo-module.

3. A semiconductor laser module as defined in claim 2, wherein the overcurrent limiting circuit includes a capacitor disposed in a bypass circuit parallel to the thermo-module.

4. A semiconductor laser module comprising:
   a semiconductor laser element;
   an optical fiber optically coupled for receiving laser light emitted from the semiconductor laser element;
   a thermo-module for adjusting the temperature of the semiconductor laser element in dependence upon an amount of current flowing into said thermo-module, said thermo-module configured to support the semiconductor laser element; and,
   an overcurrent limiting circuit to suppress an overcurrent flowing into the thermo-module, wherein the overcurrent limiting circuit includes:
      a bypass channel between an upstream side and a downstream side of the thermo-module for bypassing the thermo-module; and,
      a diode disposed within the bypass channel and oriented for allowing current to flow therethrough when the flowing current is oriented in a direction for causing heating of the semiconductor laser element, wherein in use circuit elements within the bypass channel and the diode provide an overcurrent limiting circuit to relieve the flow of an overcurrent in the direction for causing heating of the semiconductor laser element.

5. A semiconductor laser module as defined in claim 4, wherein the overcurrent limiting circuit includes a resistor disposed within the bypass channel serially to the diode.

6. A semiconductor laser module as defined in claim 5, comprising a surge suppression circuit in parallel to the bypass path for preventing surge current from flowing into said thermo-module.

7. A semiconductor laser module as defined in claim 4, wherein the overcurrent limiting circuit includes:
a zener diode disposed serially to the diode within the bypass channel and oriented opposite to the diode for providing an approximately fixed zener voltage when the flowing current is oriented in a direction for causing heating of the semiconductor laser element;
wherein in use the bypass channel, zener diode and diode provide an overcurrent limiting circuit to relieve the flow of an overcurrent in the heating direction into said thermo-module.

8. A semiconductor laser module as defined in claim 7, comprising a surge suppression circuit in parallel to the bypass path for preventing surge current from flowing into said thermo-module.

9. A semiconductor laser module as defined in claim 8 wherein the surge suppression circuit comprises a capacitor.

10. A semiconductor laser module as defined in claim 7 comprising:
a package for storing therein the semiconductor laser element and the thermo-module, the thermo-module being mounted on a first plate of the package, wherein the thermo-module comprises a first substrate adjacent the first plate, a second substrate and a Peltier element disposed therebetween;
wherein the semiconductor laser element is disposed on the second substrate and thermally connected to said thermo-module and
wherein the overcurrent limiting circuit is disposed on at least one of the first substrate and the first plate.

11. A semiconductor laser module comprising:
a semiconductor laser element;
an optical fiber optically coupled for receiving laser light emitted from the semiconductor laser element;
a thermo-module for adjusting the temperature of the semiconductor laser element in dependence upon an amount of current flowing into said thermo-module, said thermo-module configured to support the semiconductor laser element;
an overcurrent limiting circuit to suppress an overcurrent flowing into the thermo-module; and,
a package for storing therein the semiconductor laser element and the thermo-module, the thermo-module being mounted on a first plate of the package, wherein the thermo-module comprises a first substrate adjacent the first plate, a second substrate and a Peltier element disposed therebetween;
wherein the semiconductor laser element is disposed on the second substrate and thermally connected to said thermo-module and
wherein the overcurrent limiting circuit is disposed on at least one of the first substrate and the first plate.

12. A semiconductor laser module as defined in claim 11 wherein:
said thermo-module is arranged in such a manner that the first substrate is extended relative to the second substrate, and comprising a first conductor pattern and a second conductor pattern of said thermo-module disposed on an extended portion of the first substrate and
wherein one end side of said overcurrent limiting circuit is coupled to said first conductor pattern and the other end side of said overcurrent limiting circuit is coupled to said second conductor pattern.

13. A semiconductor laser module as defined in claim 4, comprising:
a lens configured to direct laser light emitted from the semiconductor laser element into the optical fiber, wherein said lens is thermally connected to the second substrate of said thermo-module.

14. A semiconductor laser module as set forth in claim 4 comprising:
a package having a through hole communicating from the inside of the package to the outside thereof for accommodating the semiconductor laser element and the thermo-module;
an optical fiber supporting member disposed within the through hole;
wherein an end portion side of the optical fiber is introduced from the outside of said package into the inside thereof via a through hole provided in said optical fiber supporting member.

15. A semiconductor laser module as defined in claim 14, wherein the end portion side of the optical fiber is formed into a lens and disposed so as to receive the laser light emitted from the semiconductor laser element.

16. A semiconductor laser module as defined in claim 4 comprising:
a package for storing therein the semiconductor laser element and the thermo-module, the thermo-module being mounted on a first plate of the package, wherein the thermo-module comprises a first substrate adjacent the first plate, a second substrate and a Peltier element disposed therebetween;
wherein the semiconductor laser element is disposed on the second substrate and thermally connected to said thermo-module and
wherein the overcurrent limiting circuit is disposed on at least one of the first substrate and the first plate.

17. A semiconductor laser module as defined in claim 16 wherein:
said thermo-module is arranged is such a manner that the first substrate is extended relative to the second substrate, and comprising a first conductor pattern and a second conductor pattern of said thermo-module disposed on an extended portion of the first substrate and
wherein one end side of said overcurrent limiting circuit is coupled to said first conductor pattern and the other end side of said overcurrent limiting circuit is coupled to said second conductor pattern.

18. A method for driving a semiconductor laser module, said semiconductor laser module having a semiconductor laser element, and a thermo-module for adjusting the temperature of the semiconductor laser element and configured to provide heating and cooling in dependence upon an orientation of the current flow therein, said method comprising:
thermally connecting said thermo-module to said semiconductor laser element;
adjusting the temperature of the semiconductor laser element in dependence upon an amount of current flowing into the thermo-module; and suppressing some of an overcurrent flowing into the thermo-module by providing an overcurrent flow limiting circuit for the thermo-module, wherein suppressing some of an overcurrent flowing into the thermo-module by providing an overcurrent flow limiting circuit for the thermo-module is performed only for current flowing in an orientation for causing heating.

19. A method for driving a semiconductor laser module as defined in claim 18 wherein the overcurrent flow limiting circuit comprises a bypass pat in parallel to the thermo-module and wherein suppressing some of an overcurrent flowing into the thermo-module by providing an overcurrent flow limiting circuit for the thermo-module is performed only when more than a predetermined voltage is provided across the thermo-module.

20. A method for driving a semiconductor laser module as defined in claim 19 wherein the overcurrent flow limiting circuit comprises a zener diode within the bypass path for maintaining the voltage across the thermo-module below a predetermined voltage.

21. A method for driving a semiconductor laser module as defined in claim 18 wherein the overcurrent flow limiting circuit comprises a bypass path in parallel to the thermo-module and wherein suppressing some of an overcurrent flowing into the thermo-module by providing an overcurrent flow limiting circuit for the thermo-module is performed only when a surge current having high frequency components is provided to the thermo-module.

22. A method for driving a semiconductor laser module as defined in claim 18 wherein the overcurrent flow limiting circuit comprises a bypass path in parallel to the thermo-module comprising a resistor and wherein suppressing some of an overcurrent flowing into the thermo-module by providing an overcurrent flow limiting circuit for the thermo-module is performed by redirecting an approximately fixed fraction of current flow within the thermo-module in the heating direction to the bypass path.

23. A transmission device comprising:
an optical element;
a thermo-module configured to support the optical element and to variably adjust the temperature of the optical element in dependence upon an amount of a current flowing into said thermo-module; and
an overcurrent limiting circuit configured to suppress an overcurrent from flowing into said thermo-module wherein the overvoltage limiting circuit comprises a diode oriented for allowing current to flow therethrough when the flowing current is oriented in a direction for causing heating of the semiconductor laser element and a Zener diode oriented opposite to the orientation of the diode, the diode and the zener diode coupled in series in parallel to the thermo-module.

24. A transmission device as set forth in claim 23, wherein at least one of the overcurrent limiting circuit and the overvoltage limiting circuit is provided in a power source apparatus.

25. A transmission device as set forth in claim 23, wherein said overcurrent limiting circuit is disposed in the power source device of said optical module.

26. A semiconductor laser module as defined in claim 1, wherein the surge suppression circuit comprises a diode disposed in series with said thermo-module.

27. A method of driving a semiconductor laser element optically coupled to an optical fiber and fixed on a thermo-module for adjusting the temperature of the semiconductor laser cement, comprising:
thermally connecting said thermo-module to said semiconductor laser element;
adjusting the temperature of the semiconductor laser element in dependence upon an amount of current flowing into the thermo-module;
providing an overcurrent flow limiting circuit including a bypass path disposed in parallel to the thermo-module; and
suppressing an overcurrent flowing into the thermo-module in an orientation for causing heating of the semiconductor laser element.

28. A method of claim 27, wherein said semiconductor laser element is fixed on said thermo-module by use of solder.

29. A method of claim 28, wherein said suppressing an overcurrent flowing into the thermo-module is performed when more than a predetermined voltage is provided across the thermo-module.

30. A method of claim 29 wherein, said providing an overcurrent flow limiting circuit includes providing a zener diode within the bypass path for maintaining the voltage across the thermo-module below a predetermined voltage.

31. A method of claim 28, wherein said suppressing an overcurrent flowing into the thermo-module is performed when a surge current is provided to the thermo-module.

32. A method of claim 28, wherein said providing an overcurrent flow limiting circuit includes providing a resistor within the bypass path; and wherein said suppressing an overcurrent flowing into the thermo-module includes redirecting a fraction of current flow within the thermo-module in the heating direction to the bypass path.

* * * * *